(12) United States Patent
Tsukihara

(10) Patent No.: US 8,338,908 B2
(45) Date of Patent: Dec. 25, 2012

(54) SEMICONDUCTOR DEVICE

(75) Inventor: Tetsuya Tsukihara, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/861,954

(22) Filed: Aug. 24, 2010

(65) Prior Publication Data

US 2011/0073944 A1   Mar. 31, 2011

(30) Foreign Application Priority Data

Sep. 25, 2009  (JP) ................................. 2009-220903

(51) Int. Cl.
*H01L 21/70* (2006.01)
(52) U.S. Cl. ..... 257/501; 257/504; 257/510; 257/E29.02
(58) Field of Classification Search .................. 257/501, 257/504, 510, E29.02
See application file for complete search history.

(56) References Cited

U.S. PATENT DOCUMENTS

| 4,551,911 | A | * | 11/1985 | Sasaki et al. | ................... | 438/359 |
| 7,405,461 | B2 | | 7/2008 | Yoneda | | |
| 7,638,409 | B2 | | 12/2009 | Yoneda | | |
| 8,115,273 | B2 | * | 2/2012 | Moens et al. | ................. | 257/519 |
| 2008/0268608 | A1 | | 10/2008 | Kim et al. | | |
| 2009/0283843 | A1 | * | 11/2009 | Alter | ............................. | 257/408 |

FOREIGN PATENT DOCUMENTS

| JP | 59-056740 | 4/1984 |
| JP | 05-218064 | 8/1993 |
| JP | 2002-319638 | 10/2002 |
| JP | 2003-297845 | 10/2003 |
| JP | 2006-108646 | 4/2006 |
| JP | 2008-277736 | 11/2008 |

OTHER PUBLICATIONS

Japanese Office Action for Japanese Application No. 2009-220903 mailed on Feb. 21, 2012.

* cited by examiner

*Primary Examiner* — Phat X Cao
(74) *Attorney, Agent, or Firm* — Turocy & Watson, LLP

(57) ABSTRACT

According to one embodiment, a semiconductor device includes: a substrate in which, on a semiconductor substrate of a first conductivity type, a buried layer of a second conductivity type and a semiconductor layer of the second conductivity type are stacked; trench that define an element forming region in the substrate; element isolation insulation film formed in the trench; and a semiconductor element formed in the element forming region. The trench include first trench formed from the surface of the substrate to boundary depth and second trench formed from the boundary depth to the bottom and having a diameter smaller than that of the first trench. First diffusion layers connected to the buried layer are formed around the first or second trench according to inter-element breakdown voltage required of the semiconductor element.

7 Claims, 19 Drawing Sheets

SEMICONDUCTOR DEVICE

CROSS-REFERENCE TO RELATED APPLICATIONS

This application is based upon and claims the benefit of priority from the prior Japanese Patent Application No. 2009-220903, filed on Sep. 25, 2009; the entire contents of which are incorporated herein by reference.

FIELD

Embodiments described herein relate generally to a semiconductor device and a method of manufacturing the semiconductor device.

BACKGROUND

In the past, as an element isolation method for a semiconductor device having a buried layer, a technique employing deep trench isolation (hereinafter "DTI") is known. The DTI is formed as explained below. First, a buried layer in which N-type impurities are dispersed at high concentration by using the ion implantation method is formed in a predetermined position of a P-type semiconductor substrate. An impurity region having concentration of N-type impurities lower than that of the buried layer is formed from the peripheral section of the buried layer to the semiconductor substrate. Subsequently, an N-type semiconductor layer is epitaxially grown on the semiconductor substrate on which the surface of the buried layer is exposed. Thereafter, a mask having openings for forming deep trench for element isolation is formed on the upper surface of the N-type semiconductor layer. The deep trench is formed by etching so that a bottom of the deep trench is reaching the semiconductor substrate and deeper than the impurity region. The deep trench is formed in positions in contact with the buried layer. Subsequently, after an insulation film that covers at least the inner surfaces of the deep trench is formed by thermal oxidation at 850° C. to 1,200° C., silicon oxide film is formed to fill the inside of the deep trench by the chemical vapor deposition (CVD) method and an unnecessary film on the upper surface of the semiconductor layer is removed to planarize the semiconductor layer by the chemical mechanical polishing (CMP) method. In this way, the DTI is formed (see, for example, Japanese Patent Application Laid-Open No. 2003-297845).

However, in the technique in the past, because the deep trench is formed in the position in contact with the buried layer, the buried layer is exposed in the deep trench after the deep trench is formed. Therefore, when sidewalls of the deep trench are oxidized, the N-type impurities of the buried layer diffuse outward to the sidewalls of the deep trench and N− layer is formed on the sidewalls of the deep trench. The N− layer formed below the buried layer has an action of relaxing the gradient of impurity concentration of the buried layer. Further, a depletion layer is extended. Therefore, there is an effect in improvement of element isolation breakdown voltage. On the other hand, the N− layers formed above the buried layer suppress the extension of the depletion layer and lower breakdown voltage in an element.

As a semiconductor device that requires the deep trench, besides a high-breakdown voltage semiconductor device such as a lateral double diffusion metal-oxide-semiconductor (LDMOS), there is a semiconductor device for high frequency that does not require high inter-element breakdown voltage unlike the LDMOS. However, in the past, after the deep trench is formed by the method explained above without distinguishing characteristics of these semiconductor devices, a semiconductor element such as a high-breakdown voltage semiconductor element or a high-frequency semiconductor element is formed in a region defined by the deep trench.

DETAILED DESCRIPTION

In general, according to one embodiment, a semiconductor device includes: a substrate in which, on a semiconductor substrate of a first conductivity type, a buried layer of a second conductivity type and a semiconductor layer of the second conductivity type having concentration of impurities of the second conductivity type lower than that of the buried layer and having predetermined thickness are stacked; trench that is formed in the substrate deeper than a forming position of the buried layer and define an element forming region in the substrate; element isolation insulation film including sidewall oxide films formed along inner wall of the trench and buried film that fill the trench covered by the sidewall oxide films; and a semiconductor element formed in the element forming region defined by the element isolation insulation film. The trench includes a first trench formed from the surface of the substrate to predetermined boundary depth and a second trench formed from the boundary depth to the bottom and having an opening diameter smaller than that of the first trench. First diffusion layers connected to the buried layer are formed around the first or second trench according to inter-element breakdown voltage required of the semiconductor element.

Exemplary embodiments of a semiconductor device and a method of manufacturing the semiconductor device will be explained below in detail with reference to the accompanying drawings. The present invention is not limited to the following embodiments. Sectional views of the semiconductor device used in the embodiments are schematic. A relation between thickness and width of a layer, a ratio of thicknesses of layers, and the like are different from actual ones. Further, film thicknesses explained below are examples and actual film thicknesses are not limited to the film thicknesses.

Figure 1:
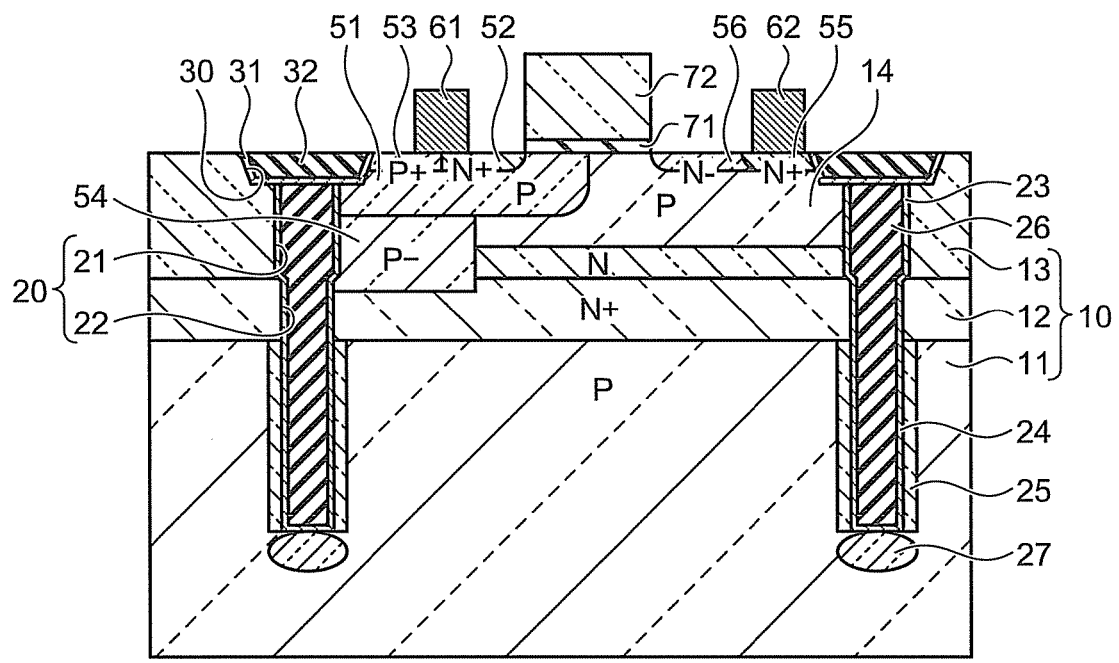
FIG. 1 is a schematic sectional view of the structure of a semiconductor device according to a first embodiment.

FIG. 1 is a schematic diagram of the structure of a semiconductor device according to a first embodiment. In an example explained below, a semiconductor device has a structure in which an LDMOS is formed in an element forming region defined by deep trench film 26 as element isolation insulation films of a P-type silicon substrate 11 on which an N+ buried layer 12 is formed.

As a substrate 10, the P-type silicon substrate 11 in which the N+ buried layer 12 is formed at predetermined depth is used. The substrate 10 has a structure in which the N+ buried layer 12 including a silicon layer in which N-type impurities are introduced and an N-type semiconductor layer 13 including a silicon layer having the concentration of the N-type impurities lower than that of the N+ buried layer 12 are formed on the P-type silicon substrate 11.

In a predetermined region of the substrate 10, deep trench 20 having predetermined depth reaching the silicon substrate 11 in a lower layer of the N+ buried layer 12 are formed in, for example, a picture frame shape in plan view. Silicon oxide film, silicon film, or the like is buried in the deep trench 20 to form deep trench film 26. A region defined by the deep trench film 26 is an element forming region. P-type diffusion layer 27 in which P-type impurities are introduced is formed in the silicon substrate 11 on the lower side of the bottoms of the deep trench 20. The P-type diffusion layer 27 has a function of electrically isolating the element forming region.

Shallow trench 30 as isolation film for insulating adjacent regions in a shallow position from the surface of the substrate 10 is formed in upper part of the deep trench film 26. Shallow trench sidewall oxide film 31 obtained by oxidizing the substrate 10 is formed on the sides and the bottom surface of the shallow trench 30. Shallow trench film 32 formed of silicon oxide film or the like is formed in the shallow trench 30.

A P-type well 14 is formed at predetermined depth from the surface of the N-type semiconductor layer 13 in the element forming region. The LDMOS is formed in the P-type well 14. In the P-type well 14, a P-type base region 51 is formed in a region where a source is formed. An N+ source region 52 and a P+ source region 53 are formed to be set in contact with each other on the surface of the P-type base region 51. A source electrode 61 is formed on the surfaces of the N+ source region 52 and the P+ source region 53 to extend over the N+ source region 52 and the P+ source region 53. A P− diffusion layer 54 is formed from the base region 51 to the N+ buried layer 12.

On the other hand, in a region where a drain of the P-type well 14 is formed, an N+ drain region 55 is formed. A drain electrode 62 is formed on the surface of the drain region 55. An N− drift region 56 is formed adjacent to the drain region 55 between the drain region 55 and the base region 51. A gate electrode 72 is formed via a gate insulation film 71 on the base region 51 and the P-type well 14 between the source electrode 61 and the drain electrode 62.

In the deep trench 20 according to the first embodiment, opening diameters are set different above and below a position higher than the N+ buried layer 12. In FIG. 1, a boundary of the different opening diameters is located near a boundary between the N+ buried layer 12 and the N-type semiconductor layer 13. The opening diameter above the boundary is large and the opening diameter below the boundary is small. In the following explanation, sections in which the opening diameter is large of the deep trench 20 are referred to as first trench 21 and sections in which the opening diameter is small are referred to as second trench 22.

First sidewall oxide films 23 are formed to cover the sides of the first trench 21. Second sidewall oxide films 24 are formed to cover the sides and the bottom surface of the second trench 22. A tetraethyl orthosilicate (TEOS) film is buried in the deep trench 20 covered by the sidewall oxide films 23 and 24. N-type diffusion layers 25 diffusing from the N+ buried layer 12 are formed around the second trench 22. On the other hand, the N-type diffusion layers 25 are not formed around the first trench 21. Although not shown in the figure, N-type diffusion layer is also formed around the second trench 22 formed in the N-type semiconductor layer 13. However, the N-type diffusion layers 25 are stopped from diffusing upward by the sidewall oxide films 23 of the first trench 21. The presence of the N-type diffusion layers 25 in the N-type semiconductor layer 13 does not affect an element characteristic.

In this way, the N-type diffusion layers 25 diffusing from the N+ buried layer 12 are not formed in the N-type semiconductor layer 13 above the N+ buried layer 12. Therefore, a desired impurity profile can be formed on the N+ buried layer 12. The N-type diffusion layers 25 are formed only in the silicon substrate 11 under the N+ buried layer 12. Therefore, the gradient of impurity concentration of the N+ buried layer 12 is relaxed and a depletion layer is extended. As a result, inter-element breakdown voltage and intra-element breakdown voltage can be improved.

Figure 2A:
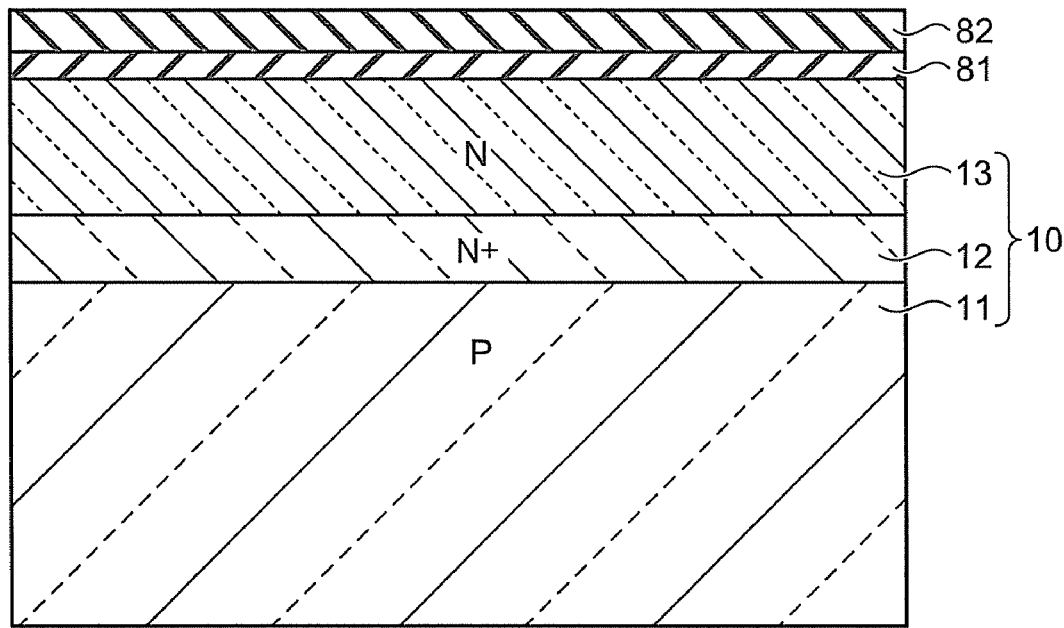
FIGS. 2A to 2P are schematic diagrams for explaining an example of a procedure of a method of manufacturing the semiconductor device according to the first embodiment.
Figure 2B:
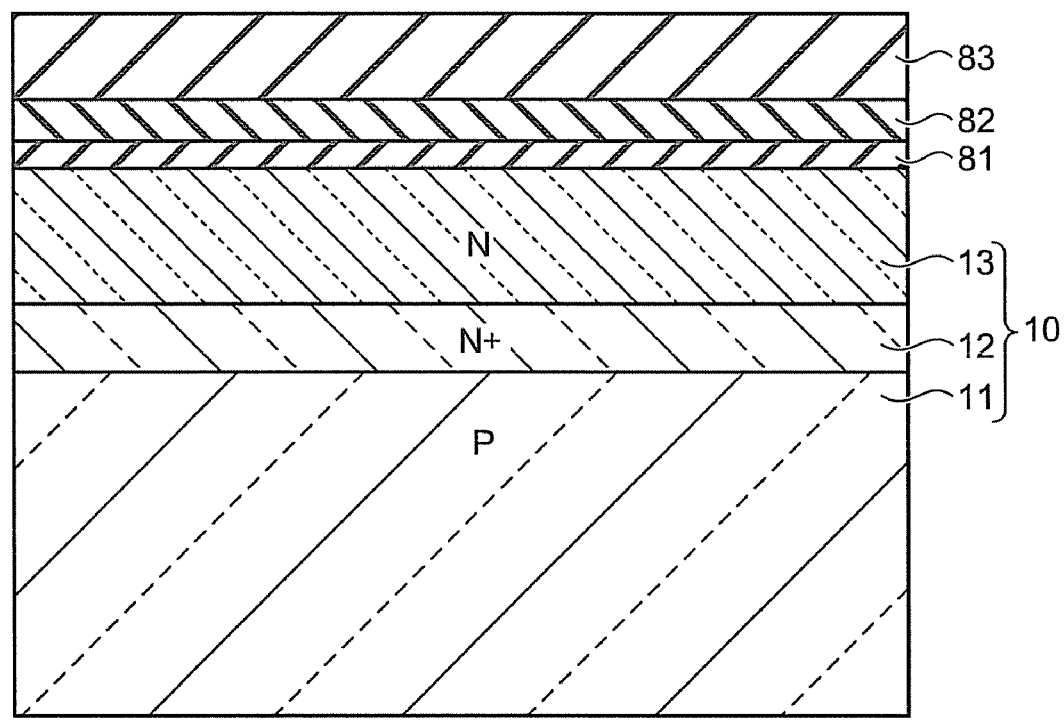
Figure 2C:
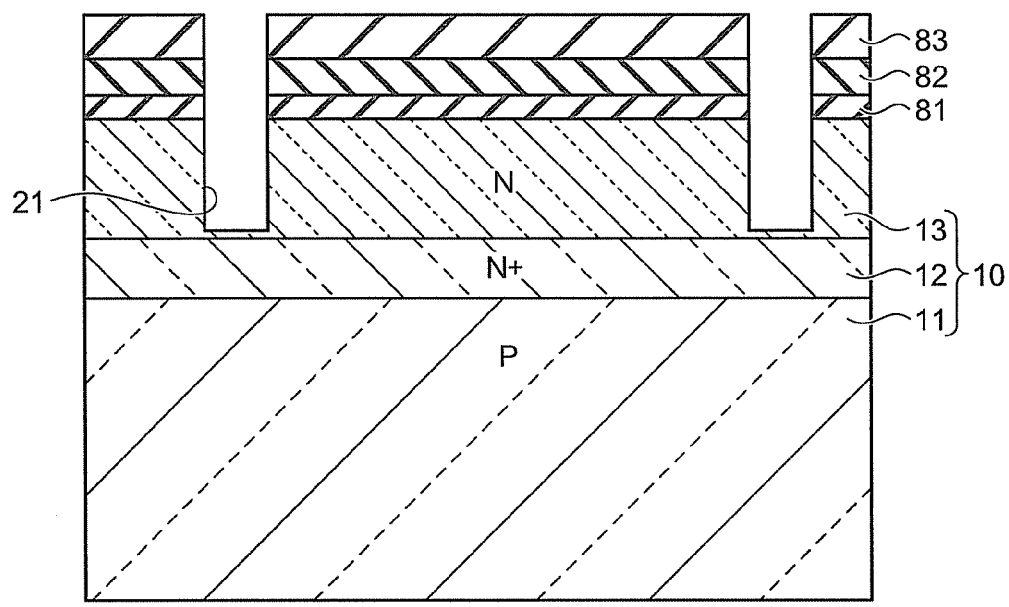
Figure 2D:
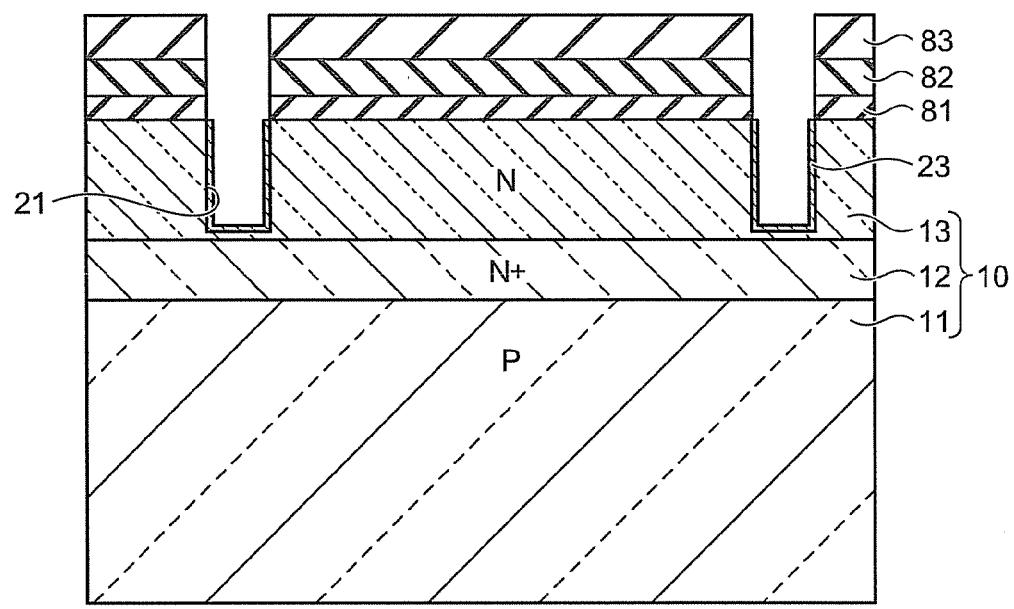
Figure 2E:
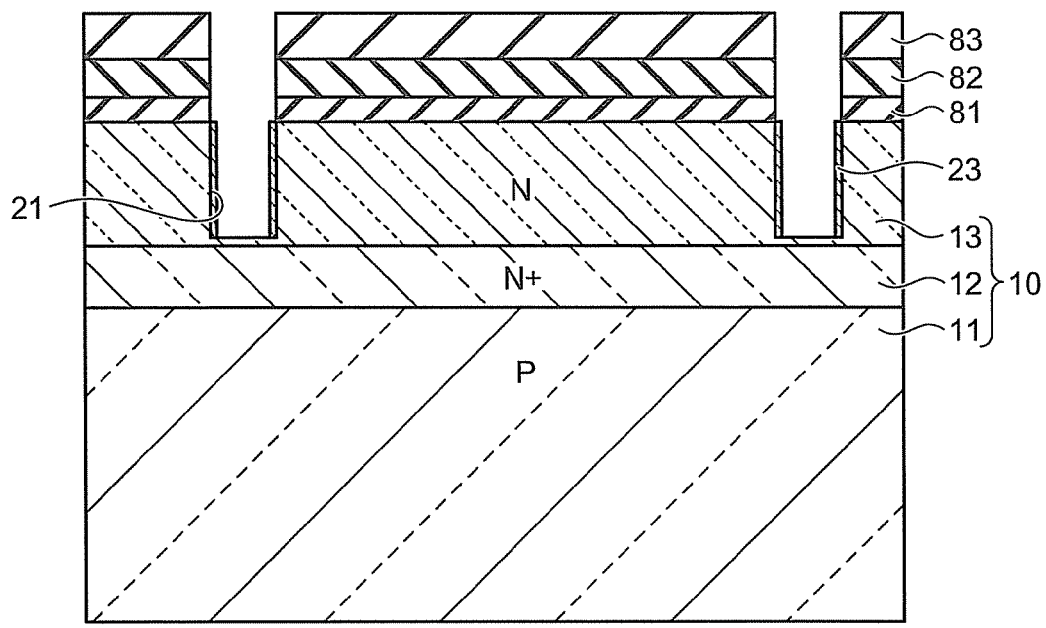
Figure 2F:
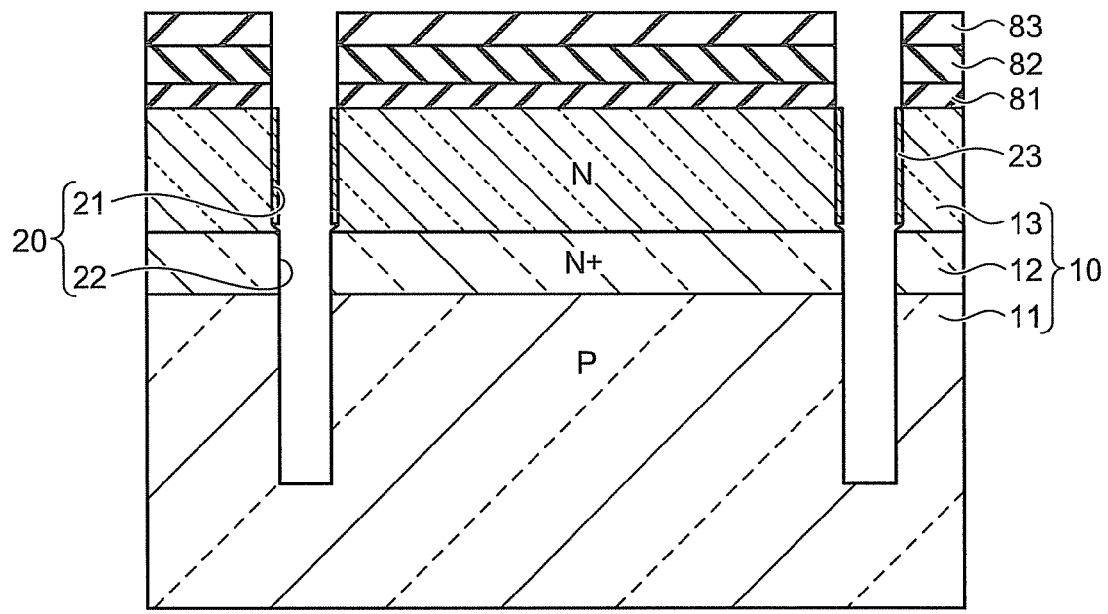
Figure 2G:
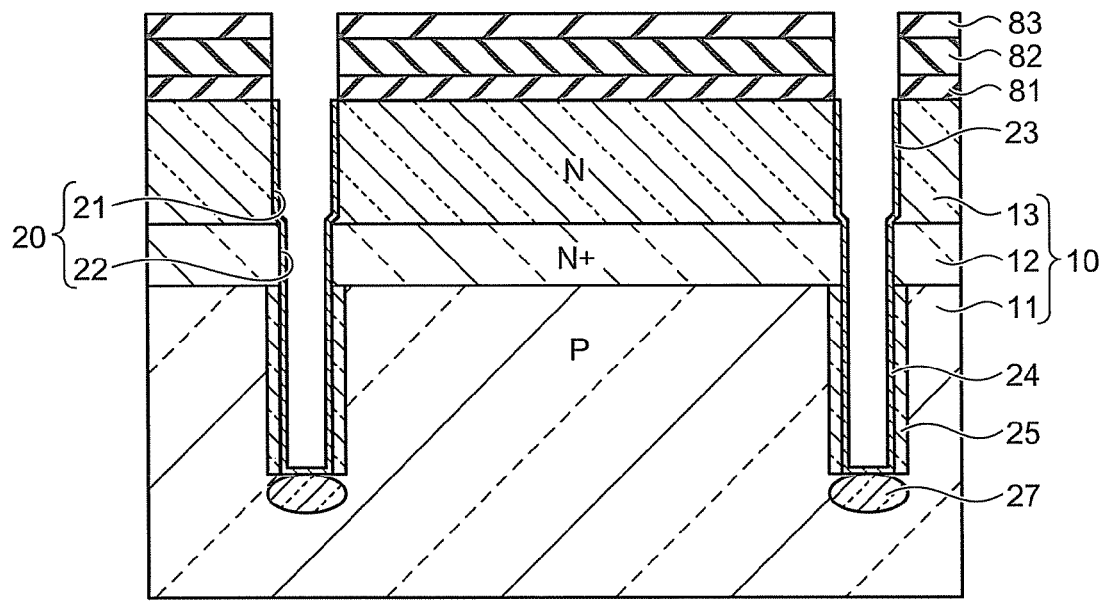
Figure 2H:
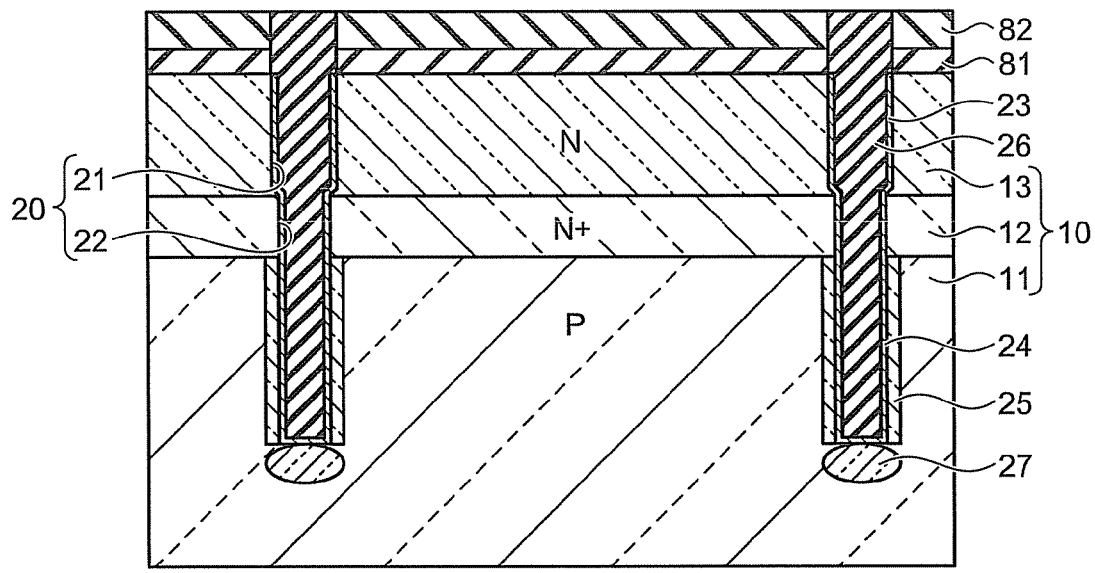
Figure 2I:
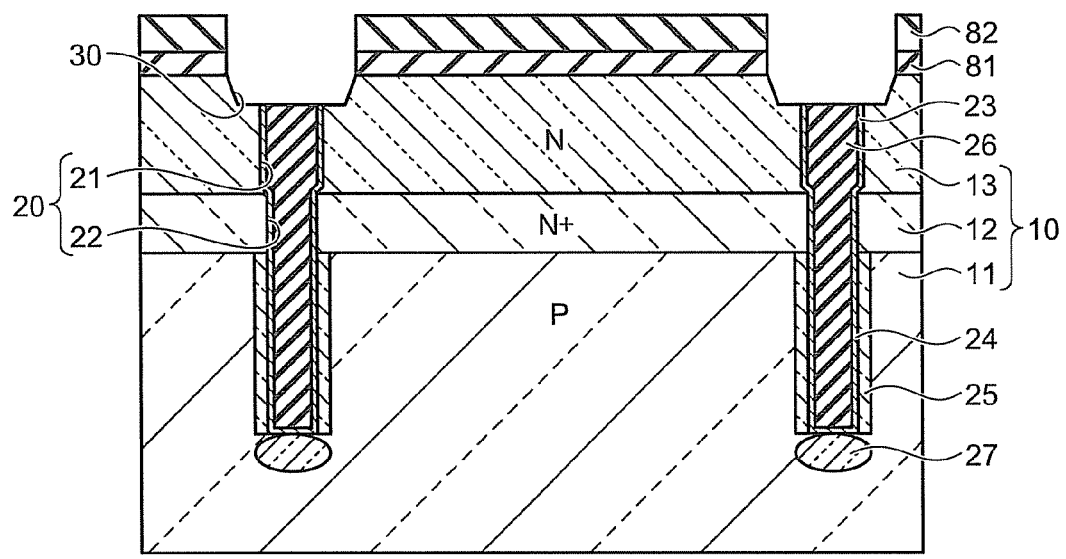
Figure 2J:
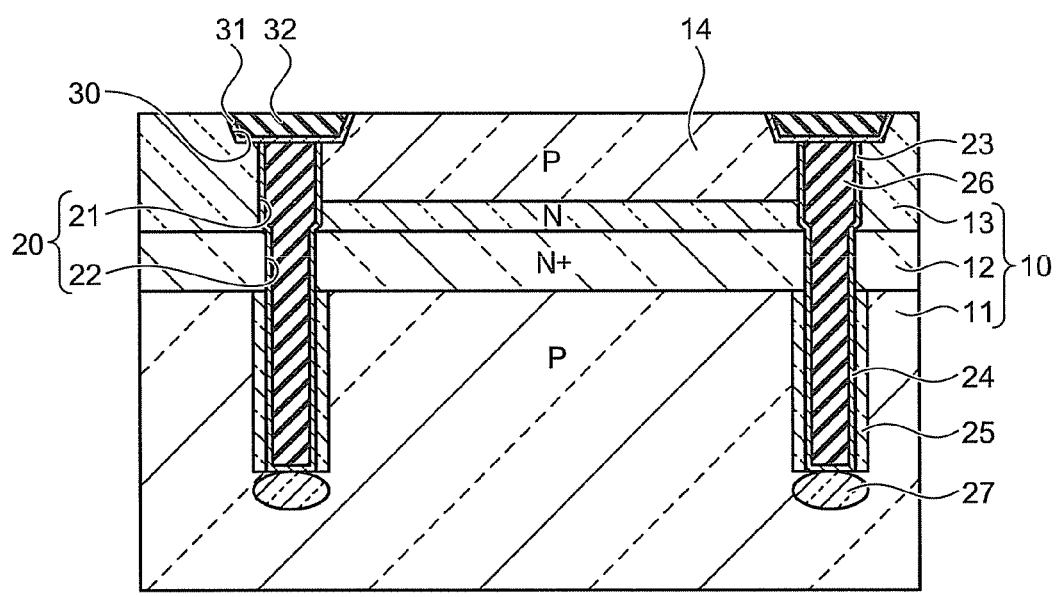
Figure 2K:
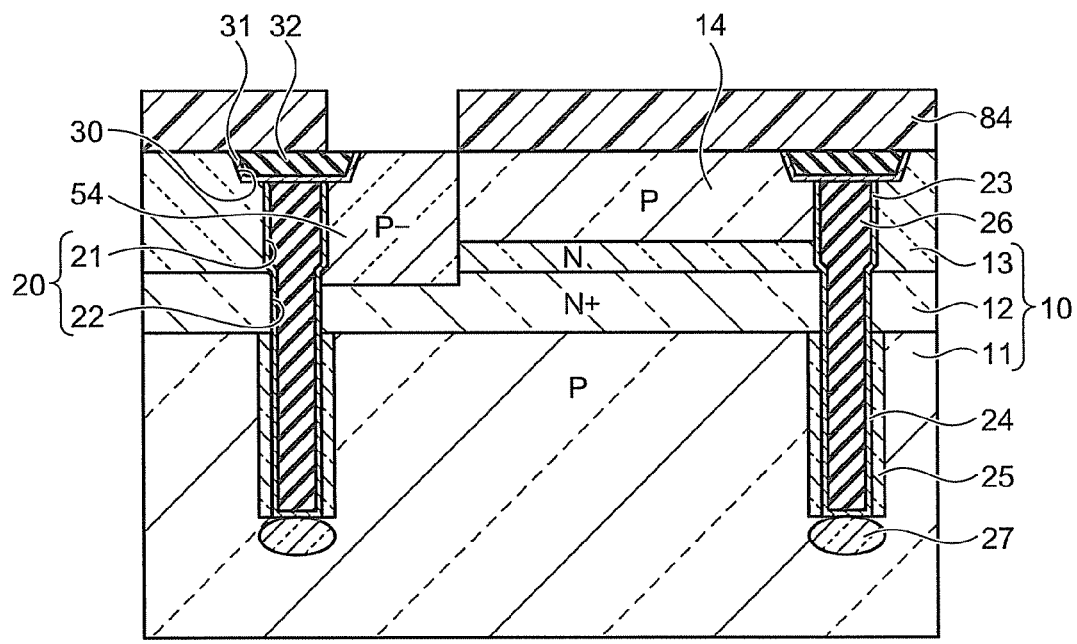
Figure 2L:
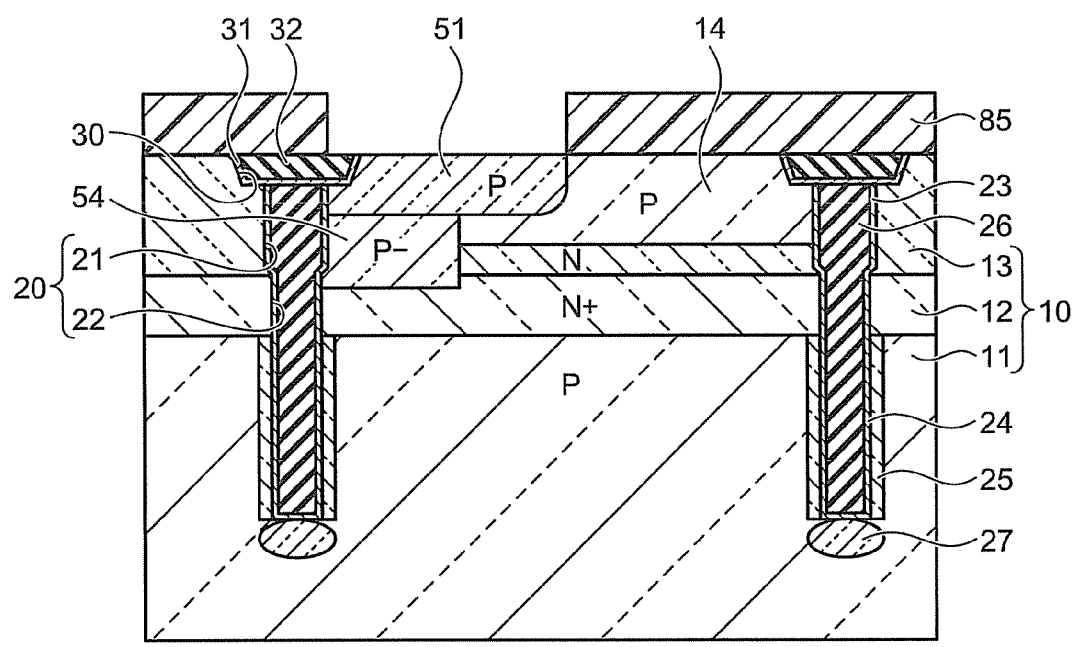
Figure 2M:
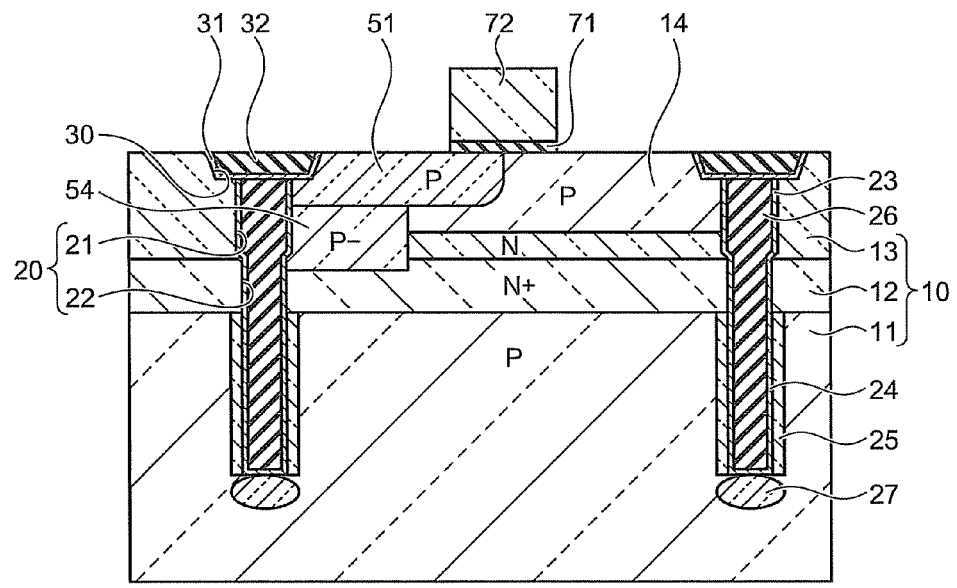
Figure 2N:
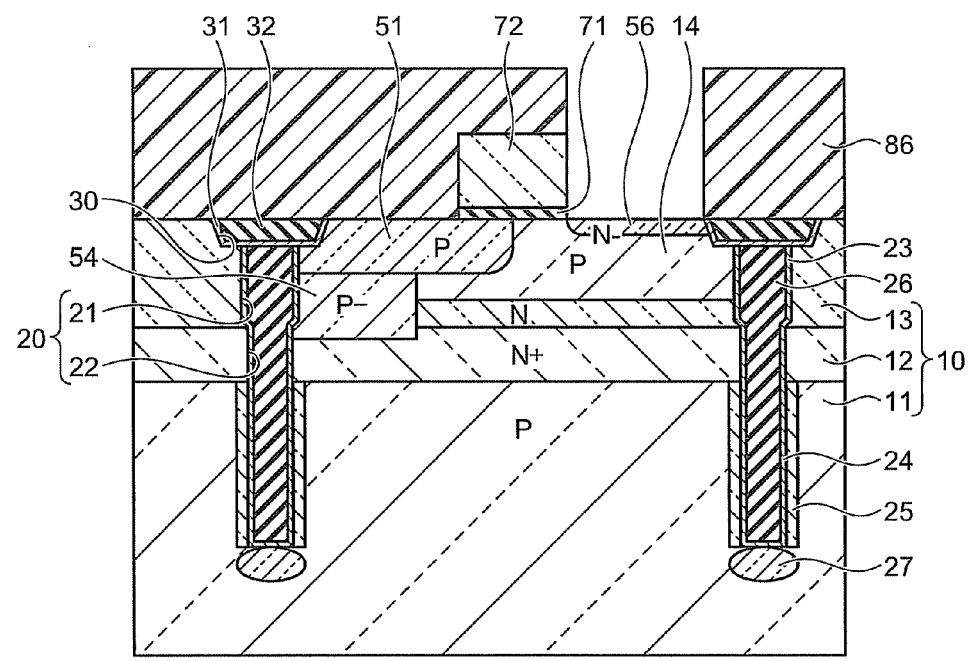
Figure 2O:
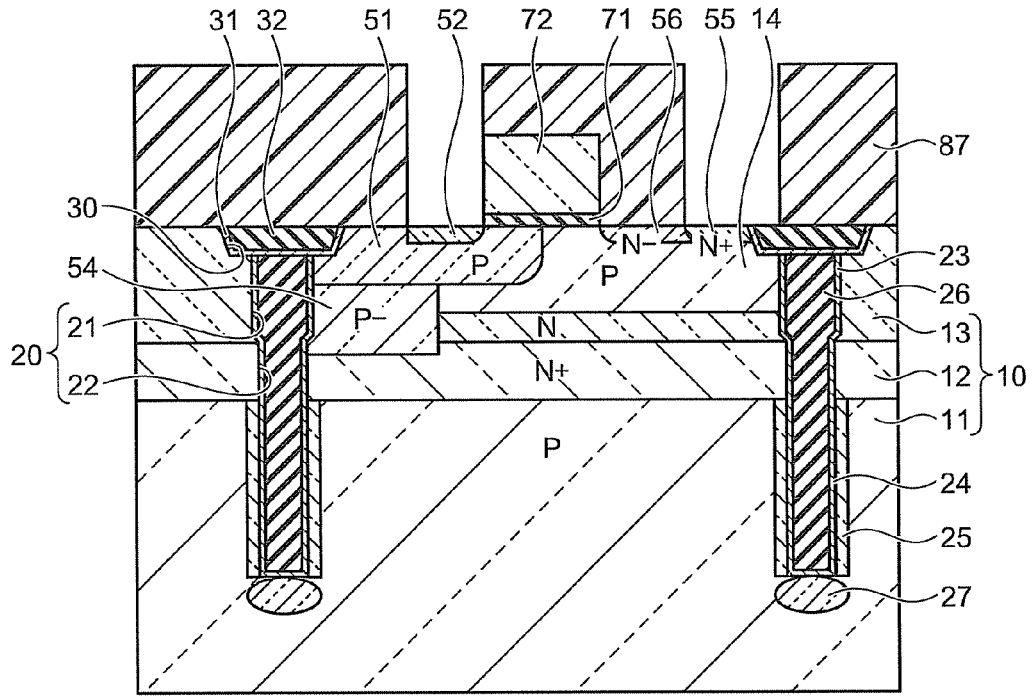
Figure 2P:
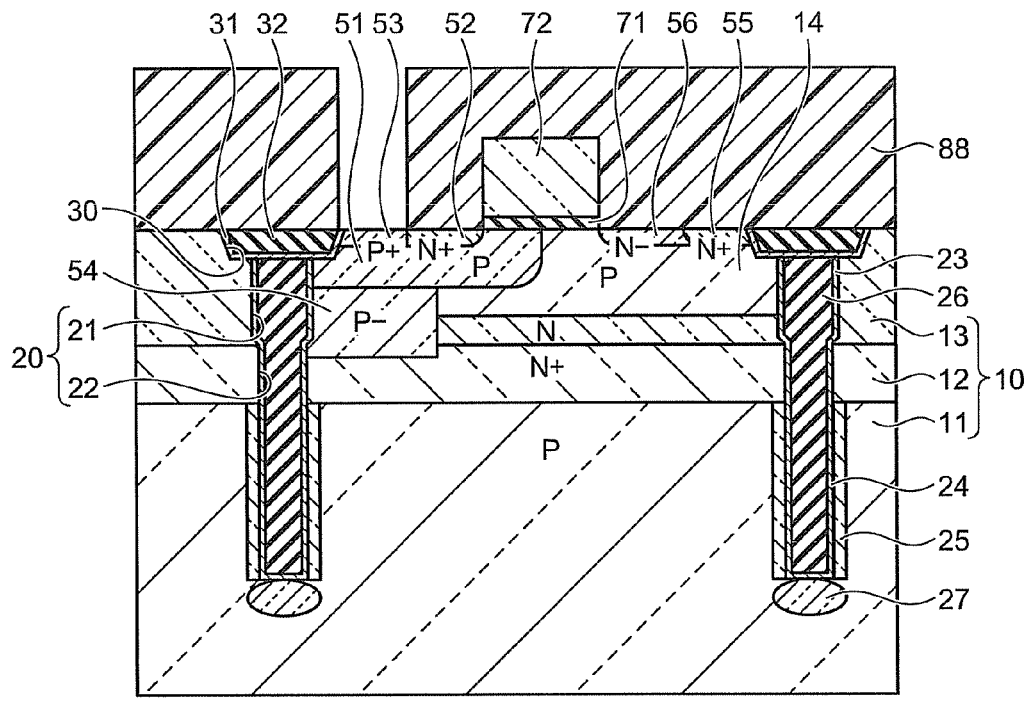

FIGS. 2A to 2P are schematic diagrams of an example of a procedure of a method of manufacturing the semiconductor device according to the first embodiment. First, as shown in FIG. 2A, the P-type silicon substrate 11 on which the N+ buried layer 12 is formed at depth of 5 micrometers from the surface of the substrate 10 is used as the substrate 10. Specifically, the substrate 10 in which the N+ buried layer 12 and the N-type semiconductor layer 13 having thickness of 5 micrometers are formed in order on the P-type silicon substrate 11 is used. A buffer oxide film 81 including an SiO film having thickness of 15 nanometers is formed on the substrate 10 by using an oxidation technique. Thereafter, a stopper film 82 including an SiN film having thickness of 200 nanometers is formed by the low pressure CVD (LPCVD) method. The buffer oxide film 81 is used as a protection film for the element forming region at a later step. The stopper film 82 is used as the stopper film 82 during CMP processing for an oxide film at a later step.

Subsequently, as shown in FIG. 2B, an SiO mask film 83 is formed over the entire surface of the stopper film 82 by the CVD method. The mask film 83 is used as a mask for reactive ion etching (RIE) for forming the deep trench 20 at a later step. Therefore, the thickness of the mask film 83 is set to depth enough for etching groove with RIE in forming the deep trench 20. It is assumed that the mask film 83 is deposited at thickness of 1,000 nanometers.

Thereafter, as shown in FIG. 2C, a not-shown resist is applied over the mask film 83 and patterning for determining forming regions of the deep trench 20 is performed by using a lithography technique. It is assumed that patterning for forming the deep trench 20 having opening width of 0.7 micrometer and formed in a substantially rectangular picture frame shape is performed. Subsequently, the mask film 83, the stopper film 82, and the buffer oxide film 81 are etched to reach the N-type semiconductor layer 13 by using the RIE method with the patterned resist as a mask. After the resist is removed by resist stripping, the substrate 10 is etched by the RIE method with the patterned mask film 83 as a mask. An etching amount of the substrate 10 at this point is set to depth not reaching the N+ buried layer 12, i.e., 4 micrometers form the surface of the substrate 10 (the N-type semiconductor layer 13). Consequently, the first trench 21 is formed. The thickness of the mask film 83 is set to, for example, about 200 nanometers.

Subsequently, as shown in FIG. 2D, silicon exposed on the inner surface of the first trench 21 is oxidized by the oxidation technique to form the first sidewall oxide films 23 having thickness of 50 nanometers on the sidewalls and the bottom surface of the first trench 21. The first sidewall oxide films 23 are used as insulation films for element isolation. At a point when the first sidewall oxide films 23 are formed, because the position of the bottom surface of the first trench 21 is above the forming position of the N+ buried layer 12, the N+ buried layer 12 is not exposed. Therefore, outward diffusion due to the N-type impurities included in the N+ buried layer 12 is not caused by the oxidation. In other words, on the sides of the inner walls of the first trench 21, the N-type diffusion layers 25 diffusing from the N+ buried layer 12 are not formed and the first sidewall oxide films 23 formed by only the silicon oxide films are formed.

Thereafter, as shown in FIG. 2E, etching of the entire surface is performed by using the RIE method. Specifically, etch-back is performed by the RIE method to remove the first sidewall oxide films 23 formed on the bottom of the first trench 21. Therefore, the first sidewall oxide films 23 are left as sidewalls only on the sides of the first trench 21.

Subsequently, as shown in FIG. 2F, the second trench 22 is formed below the first trench 21 in a self-aligning manner by the RIE method with the mask film 83 left by about 200 nanometers as a mask. The depth of the second trench 22 is set to 10 micrometers including the depth (4 micrometers) of the first trench 21. Consequently, the deep trench 20 including the first trench 21 and the second trench 22 is formed.

After the second trench 22 is formed, as shown in FIG. 2G, the second sidewall oxide films 24 having thickness of 50 nanometers are formed on the inner surfaces (the sides and the bottom surfaces) of the second trench 22 by the oxidation technique. In this oxidation processing, because the N+ buried layer 12 is exposed to the surface by the formation of the second trench 22, outward diffusion occurs during the oxidation processing. As a result, the N-type diffusion layers 25 diffusing from the N+ buried layer 12 are formed on the inner walls of the second trench 22. However, because the surfaces of the sidewalls of the first trench 21 above the N+ buried layer 12 are protected by the first sidewall oxide films 23 (the sidewalls), the N-type diffusion layers 25 do not diffuse to the silicon. The bottom of the first trench 21 and the upper surface of the N+ buried layer 12 do not coincide with each other. Therefore, when the second sidewall oxide films 24 are formed, although not shown in the figures, N-type diffusion layers are also formed in the N-type semiconductor layer 13 around the second trench 22 between the bottom of the first trench 21 and the N+ buried layer 12. However, regions where the N-type diffusion layers are formed are parts of the N-type semiconductor layer 13. N-type diffusion layers are not formed above the regions. Therefore, the element characteristic is not deteriorated. Consequently, in the deep trench 20, the N-type diffusion layers 25 are formed only around the sides of the second trench 22. Thereafter, to improve breakdown voltage of element isolation, ion implantation is performed to form the P-type diffusion layer 27 on the bottom of the deep trench 20. Specifically, boron (B) is injected to form the P-type diffusion layer 27.

Subsequently, as shown in FIG. 2H, a TEOS film having thickness of 500 nanometers is formed by the LPCVD method over the entire surface on the mask film 83 in which the deep trench 20 is formed. Consequently, the TEOS film is formed on the mask film 83 and buried in the deep trench 20. Thereafter, the TEOS film formed on the mask film 83 is removed and planarized by the CMP method. Further, the TEOS film is etched by the RIE method with the stopper film 82 as a stopper. Specifically, the etching is performed until the surface of the stopper film 82 is exposed under a condition in which the TEOS film is more easily etched than the stopper film 82. Consequently, the deep trench film 26 including the TEOS film is formed in the deep trench 20.

Thereafter, a not-shown mask material insulation film as a mask material for processing the shallow trench 30 is formed on the stopper film 82 at thickness of, for example, 100 nanometers. A not-shown resist is applied over the mask material insulation film and patterning for forming the shallow trench 30 for isolating an active region is performed by the lithography technique.

Subsequently, as shown in FIG. 2I, the mask material insulation film, the stopper film 82, and the buffer oxide film 81 are etched by the RIE method with the patterned resist as a mask. A pattern for shallow trench formation is transferred onto the mask material insulation film. After the resist is removed by resist stripping, the substrate 10 (the N-type semiconductor layer 13) is etched with the mask material insulation film as a mask to form the shallow trench 30. The depth of the shallow trench is set to 0.4 micrometer. Because depth from the upper surface of the N+ buried layer 12 to the surface of the substrate 10 is about 5 micrometers, the depth of the shallow trench 30 is sufficiently small. The TEOS film in the deep trench 20 is simultaneously etched during the processing of the shallow trench 30. Therefore, the shallow trench 30 is also formed in the upper parts of the deep trench 20.

Subsequently, as shown in FIG. 2J, the shallow trench sidewall oxide film 31 having thickness of 50 nanometers is formed by the oxidation technique for the purpose of protecting the sidewalls of the shallow trench 30. Thereafter, the TEOS film is filled with the shallow trench 30 by the LPCVD method. Steps formed after the film formation are planarized by the CMP method with the stopper film 82 as a stopper. After the CMP processing, the unnecessary stopper film 82 is removed by the wet etching method using hot phosphoric acid or the like. Consequently, the shallow trench film 32 is formed in the shallow trench 30. A region on the substrate 10 defined by the deep trench film 26 and the shallow trench film 32 is formed as an element forming region. P-type impurities such as B are implanted into the element forming region by the ion implantation method and activated to form the P-type well 14 in a region shallower than the lower surface of the N-type semiconductor layer 13.

Thereafter, formation of an LDMOS on the element forming region is performed. First, as shown in FIG. 2K, a resist 84 is applied over the entire surface on the substrate 10 in which the deep trench film 26 is formed and patterned by the lithography technique to have opening near a source region forming region. The P-type impurities such as B are introduced to the depth of the N+ buried layer 12 from the surface of the substrate 10 and activated to form the P– diffusion layer 54.

After the resist 84 is removed by a method such as resist stripping, as shown in FIG. 2L, a resist 85 is applied over the entire surface on the substrate 10 and patterned by the lithography technique to have opening in the base region 51. The P-type impurities such as B are introduced to predetermined depth in the P-type well 14 from the surface of the substrate 10 by the ion implantation method and activated to form the base region 51. The concentration of the P-type impurities of the base region 51 is adjusted to be higher than that of the P-diffusion layer 54.

After the resist 85 is removed by the method such as resist stripping, an insulation film and a conductive material film such as a polysilicon film are stacked on the substrate 10. After a not-shown resist is applied over the conductive material film and patterned into a gate electrode shape, etching is performed by a method such as the RIE method with the resist as a mask. Consequently, as shown in FIG. 2M, a gate insulation film 71 and a gate electrode 72 are formed on the substrate 10. Specifically, a stacked member of the gate insulation film 71 and the gate electrode 72 is formed to extend across a boundary between the P-type well 14 and the base region 51.

Subsequently, as shown in FIG. 2N, a resist 86 is applied over the substrate 10 on which the gate electrode 72 is formed and patterned by the lithography technique such that the drift region 56 and the drain region 55 are opened. N-type impurities such as P are introduced to predetermined depth from the surface of the substrate 10 by the ion implantation method and activated to form the drift region 56.

After the resist 86 is removed by the method such as resist stripping, as shown in FIG. 2O, a resist 87 is applied over the substrate 10 and patterned by the lithography technique such that the drain region 55 and the N+ source region 52 are opened. The N-type impurities such as P are introduced to predetermined depth from the surface of the substrate 10 by the ion implantation method and activated to form the drain region 55 and the N+ source region 52. The concentration of the N-type impurities is adjusted to be higher than that of the drift region 56.

After the resist 87 is removed by the method such as resist stripping, as shown in FIG. 2P, a resist 88 is applied over the substrate 10 and patterned by the lithography technique such that the P+ source region 53 is opened. The P-type impurities such as B are introduced to predetermined depth from the surface of the substrate 10 by the ion implantation method and activated to form the P+ source region 53.

After the resist 88 is removed by the method such as resist stripping, for example, a resist is applied over the substrate 10 and patterned by the lithography technique such that a part of the drain region 55 and parts of the N+ source region 52 and the P+ source region 53 are opened. Conductive material films are formed in the openings and the resist is removed. Consequently, as shown in FIG. 1, the source electrode 61 and the drain electrode 62 are formed. According to the procedure explained above, an LDMOS is manufactured.

Figure 3:
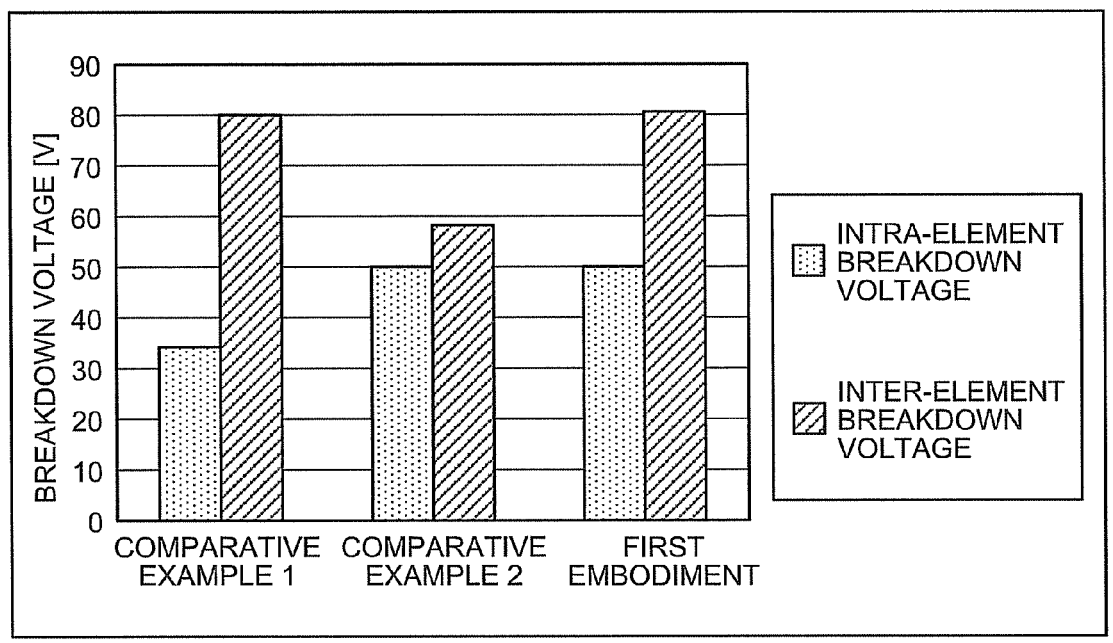
FIG. 3 is a diagram of an example of inter-element breakdown voltage and intra-element breakdown voltage according to a difference in the configuration of deep trench.

FIG. 3 is a diagram of an example of inter-element breakdown voltage and intra-element breakdown voltage according to a difference in the configuration of deep trench. Breakdown voltage is measured by using an LDMOS formed by using a technique for manufacturing a device having a minimum dimension of 0.13 micrometers. In a comparative example 1, as described in Japanese Patent Application Laid-Open No. 2003-297845, when oxide film is formed on the sidewalls of the deep trench, N-type diffusion layer diffusing from N+ buried layer is formed along the sidewalls of the deep trench. In a comparative example 2, oxidation is performed under a condition in which outward diffusion of the N-type diffusion layer is suppressed in the case of the comparative example 1. The ordinate indicates breakdown voltage [V].

In the comparative example 1, impurities in the N+ buried layer diffuse, whereby the gradient of impurity concentration of the N+ buried layer is relaxed and a depletion layer is extended in a lower part of the N+ buried layer. Therefore, the inter-element breakdown voltage is improved. However, because the extension of the depletion layer is suppressed in an upper part of the N+ buried layer, the intra-element breakdown voltage falls. In the comparative example 2, the outward diffusion of the N+ buried layer is suppressed according to an oxidation condition. As a result, conversely to the comparative example 1, the intra-element breakdown voltage is improved but the inter-element breakdown voltage falls.

On the other hand, in the first embodiment, as the deep trench 20, the first trench 21 above the N+ buried layer 12 and the second trench 22 formed below the first trench 21 and having the bottoms in the deeper position than the N+ buried layer 12 are separately formed. Specifically, only the first sidewall oxide films 23 are formed along the sidewalls of the first trench 21. Thereafter, the second sidewall oxide films 24 are formed along the sidewalls of the second trench 22 and, at the same time, the N-type diffusion layers 25 diffusing from the N+ buried layer 12 are formed on the outer sides of the second sidewall oxide films 24. Consequently, there is an effect that it is possible to improve the inter-element breakdown voltage as in the comparative example 1 and also improve the intra-element breakdown voltage as in the comparative example 2.

When the deep trench 20 is formed, the first trench 21 is formed such that the bottom thereof is located in the position above the upper surface of the N+ buried layer 12. Therefore, when the first sidewall oxide films 23 are formed on the sidewalls of the first trench 21, the N-type impurities of the N+ buried layer 12 do not diffuse to the section around the first trench 21. Further, even if the oxidation processing is performed after the second trench 22 is formed, because the first sidewall oxide films 23 are formed on the sidewalls of the first trench 21, the N-type impurities of the N+ buried layer 12 do not diffuse to the section around the sidewalls of the first trench 21.

The second trench 22 is formed by using the mask film 83 in which the first trench 21 is formed. Therefore, it is possible to control the impurity layer formed on the sides of the deep trench 20 only by adding a minimum process to the processes for manufacturing the deep trench 20 in the past without performing separate lithography processes to form the first and second trenches 21 and 22.

Figure 4:
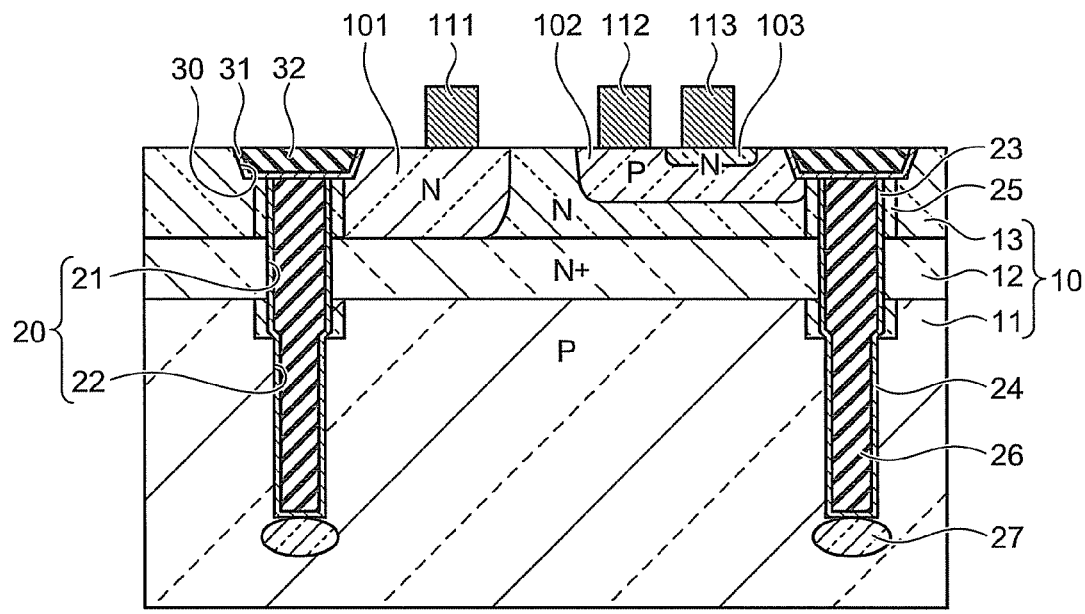
FIG. 4 is a schematic sectional view of the structure of a semiconductor device according to a second embodiment.

FIG. 4 is a schematic sectional view of the structure of a semiconductor device according to a second embodiment. In an example explained in the second embodiment, a semiconductor device has a structure in which a high-frequency semiconductor element is formed in the element forming region defined by the deep trench film 26 of the P-type silicon substrate 11 on which the N+ buried layer 12 is formed.

As the substrate 10, the P-type silicon substrate 11 in which the N+ buried layer 12 is formed at predetermined depth is used. As in the first embodiment, the substrate 10 has the structure in which the N+ buried layer 12 and the N-type semiconductor layer 13 are formed on the P-type silicon substrate 11. However, unlike the first embodiment, the thickness of the N-type semiconductor layer 13 is thin. For example, whereas the thickness of the N-type semiconductor layer 13 (a distance from the surface of the substrate 10 to the upper surface of the N+ buried layer 12) is about 5 micrometers in the first embodiment, the thickness is about 1 micrometer in the second embodiment.

In a predetermined region of the substrate 10, the deep trench 20 having predetermined depth reaching the silicon substrate 11 in a lower layer of the N+ buried layer 12 is formed in, for example, a picture frame shape in plan view. Silicon oxide film, silicon film, or the like is buried in the deep trench 20 to form the deep trench film 26. A region defined by the deep trench film 26 is an element forming region. The P-type diffusion layer 27 in which P-type impurities for electrically isolating the element forming region are introduced is formed in the silicon substrate 11 on the lower side of the bottom of the deep trench 20.

The shallow trench 30 is formed in the upper part of the deep trench film 26. The shallow trench sidewall oxide film 31 obtained by oxidizing the substrate 10 is formed on the side and the bottom surfaces of the shallow trench 30. The shallow trench film 32 formed of silicon oxide film or the like is formed in the shallow trench 30.

An NPN bipolar transistor is formed as a high-frequency semiconductor element in the element forming region. Specifically, an N-type collector region 101 reaching the N+ buried layer 12 is formed in the N-type semiconductor layer 13 in the element forming region. A P-type base region 102 separated from a forming position of the collector region 101 by the N-type semiconductor layer 13 is formed in an upper part of the N-type semiconductor layer 13. An N-type emitter region 103 is formed in an upper part of the base region 102. A collector electrode 111, a base electrode 112, and an emitter electrode 113 are respectively formed on the collector region 101, the base region 102, and the emitter region 103.

In the deep trench 20 according to the second embodiment, opening diameters are set different above and below a position lower than the N+ buried layer 12. In FIG. 4, a boundary of the different opening diameters is located in the silicon substrate 11 below the N+ buried layer 12. The opening diameter above the boundary is large and the opening diameter below the boundary is small. In the following explanation, section in which the opening diameter is large of the deep trench 20 is referred to as first trench 21 and section in which the opening diameter is small is referred to as second trench 22.

The first sidewall oxide films 23 are formed to cover the sides of the first trench 21. The second sidewall oxide films 24 are formed to cover the sides and the bottom surfaces of the second trench 22. A TEOS film is buried in the deep trench 20 covered by the sidewall oxide films 23 and 24. The N-type diffusion layers 25 diffusing from the N+ buried layer 12 are formed around the first trench 21. However, the N-type diffusion layers 25 are not formed around the second trench 22. The first trench 21 reaches the P-type silicon substrate 11. The N-type diffusion layers 25 are also formed around the first trench 21 in the P-type silicon substrate 11. However, the N-type diffusion layers 25 are stopped from diffusing downward by the sidewall oxide films 23 of the first trench 21. The presence of the N-type diffusion layers 25 in the N-type semiconductor layer 13 does not affect an element characteristic.

In this way, the N-type diffusion layers 25 diffusing from the N+ buried layer 12 are not formed in the P-type silicon substrate 11 below the N+ buried layer 12 (the P-type silicon substrate 11 below the forming positions of the first trench 21). Therefore, extension of a depletion layer is suppressed in a lower part of the N+ buried layer 12. As a result, interelement breakdown voltage is inferior compared with that in the first embodiment. However, in the case of the high-frequency semiconductor element, low breakdown voltage does not basically pose a serious problem. Instead, the capacitance of the element isolation region can be reduced.

Figure 5A:
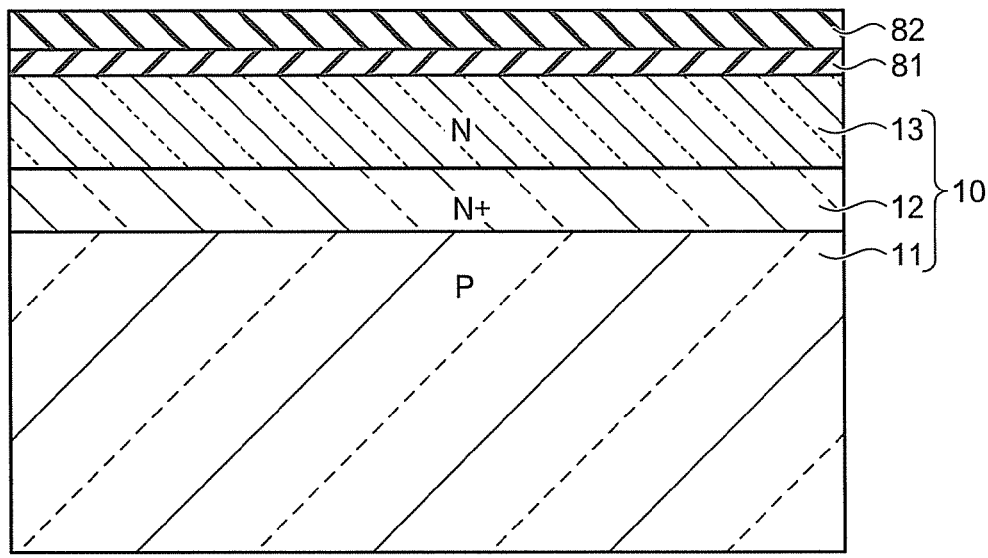
FIGS. 5A to 5M are schematic diagrams for explaining an example of a procedure of a method of manufacturing the semiconductor device according to the second embodiment.

FIGS. 5A to 5M are schematic diagrams of an example of a procedure of a method of manufacturing the semiconductor device according to the second embodiment. First, as shown in FIG. 5A, the P-type silicon substrate 11 on which the N+ buried layer 12 is formed at depth of 1 micrometer from the surface of the substrate 10 is used as the substrate 10. Specifically, the substrate 10 in which the N+ buried layer 12 and the N-type semiconductor layer 13 having thickness of 1 micrometer are formed in order on the P-type silicon substrate 11 is used. The buffer oxide film 81 including an SiO film having thickness of 15 nanometers is formed on the substrate 10 by using the oxidation technique. Thereafter, the stopper film 82 including an SiN film having thickness of 200 nanometers is formed by the LPCVD method. The buffer oxide film 81 is used as a protection film for the element forming region at a later step. The stopper film 82 is used as the stopper film 82 during CMP processing for an oxide film at a later step.

Figure 5B:
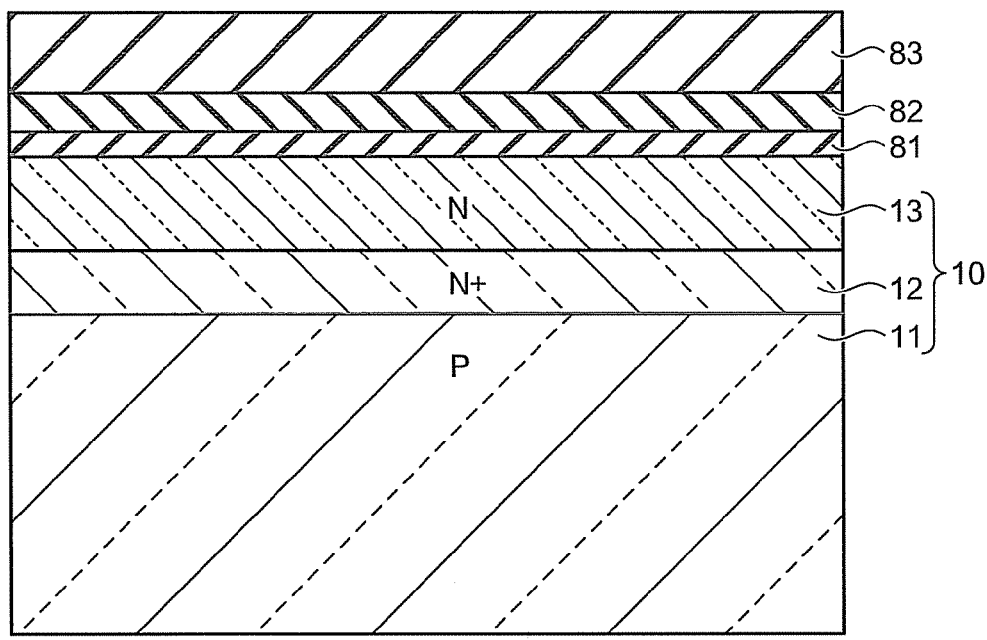

Subsequently, as shown in FIG. 5B, the SiO mask film 83 is formed over the entire surface of the stopper film 82 by the CVD method. The mask film 83 is used as a mask for RIE for forming the deep trench 20 at a later step. Therefore, the thickness of the mask film 83 is set to depth enough for etching groove with RIE in forming the deep trench 20. It is assumed that the mask film 83 is deposited at thickness of 1,000 nanometers.

Figure 5C:
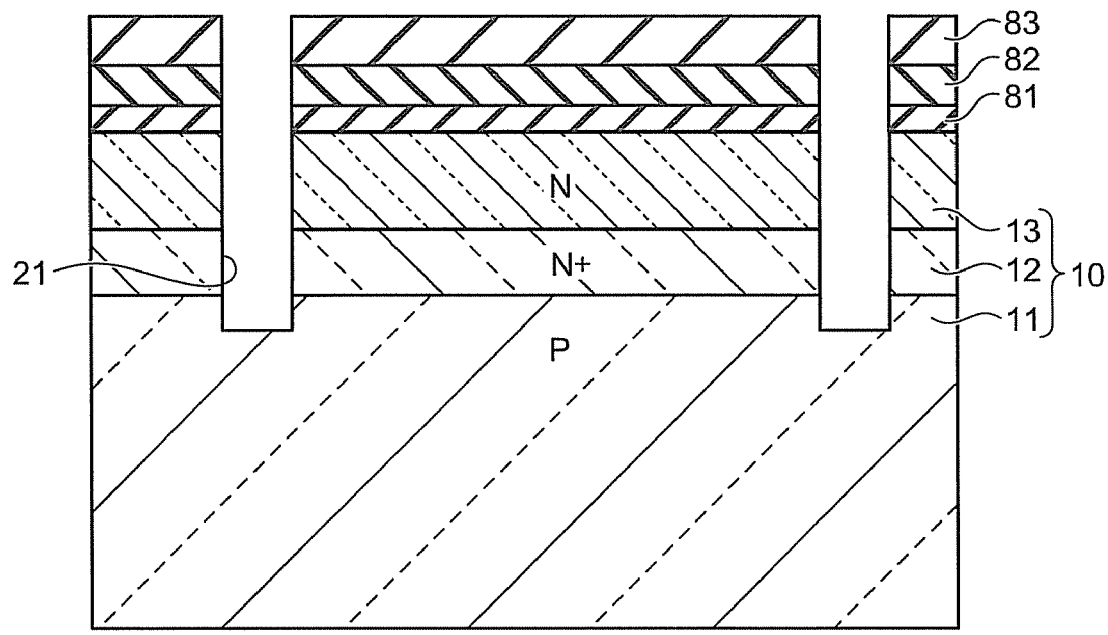

Thereafter, as shown in FIG. 5C, a not-shown resist is applied over the mask film 83 and patterning for determining forming regions of the deep trench 20 is performed by using the lithography technique. Opening width of the deep trench 20 is set to 0.7 micrometer. Subsequently, the mask film 83, the stopper film 82, and the buffer oxide film 81 are etched to the N-type semiconductor layer 13 by using the RIE method with the patterned resist as a mask. After the resist is removed by resist stripping, the N-type semiconductor layer 13, the N+ buried layer 12, and the P-type silicon substrate 11 are etched by the RIE method with the patterned mask film 83 as a mask. An etching amount of the substrate 10 at this point is set to depth larger than the depth of the bottom (the lower surface) of the N+ buried layer 12, i.e., 2 micrometers from the surface of the substrate 10 (the N-type semiconductor layer 13). Consequently, the first trench 21 is formed. The thickness of the mask film 83 is set to, for example, about 200 nanometers.

Figure 5D:
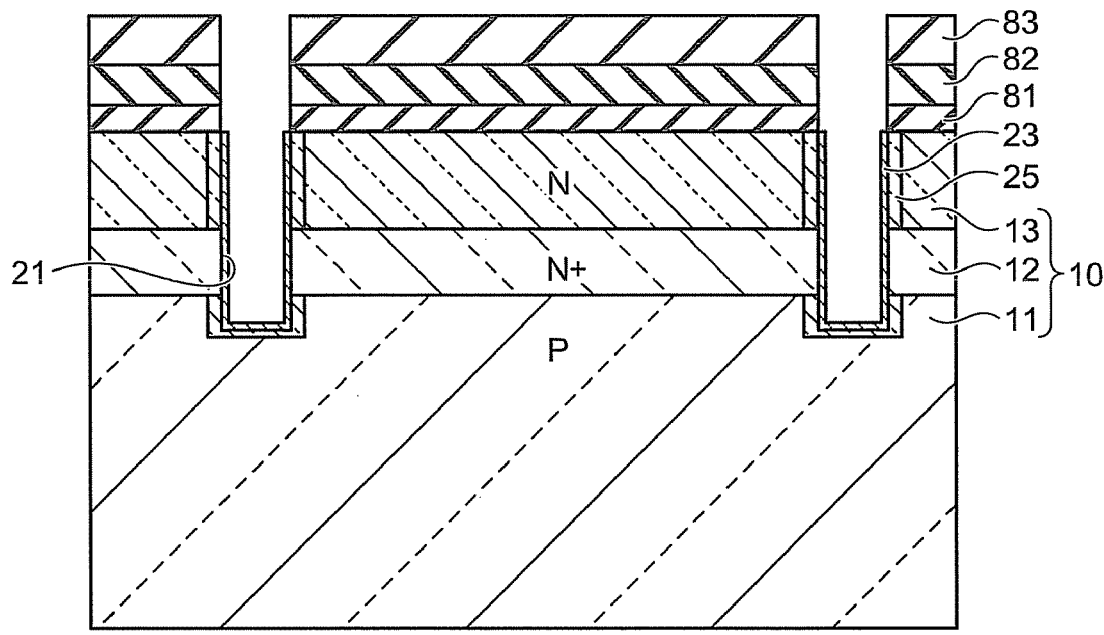

Subsequently, as shown in FIG. 5D, silicon exposed on the inner surface of the first trench 21 is oxidized by the oxidation technique to form the first sidewall oxide films 23 having thickness of 50 nanometers on the sidewalls and the bottom surfaces of the first trench 21. The first sidewall oxide films 23 are used as insulation films for element isolation. At a point when the first sidewall oxide films 23 are formed, because the N+ buried layer 12 is exposed on the inner walls of the first trench 21, outward diffusion due to the N-type impurities included in the N+ buried layer 12 is caused by the oxidation. As a result, in the inside of the side of the first trench 21, the first sidewall oxide films 23 are formed by the oxidation of the substrate 10. On the outer circumferences of the side of the first trench 21, the N-type diffusion layers 25 diffusing from the N+ buried layer 12 are formed. The bottom of the first trench 21 and the lower surface of the N+ buried layer 12 do not coincide with each other. Therefore, when the first sidewall oxide films 23 are formed, the N-type diffusion layers 25 are also formed in the N-type semiconductor layer 13 around the first trench 21 between the bottom of the first trench 21 and the lower surface of the N+ buried layer 12. However, regions where the N-type diffusion layers 25 are formed are parts of the P-type silicon substrate 11. The N-type diffusion layers 25 are not formed around the second trench 22 below the N-type diffusion layers 25 to be formed later. Therefore, an element characteristic is not markedly deteriorated.

Figure 5E:
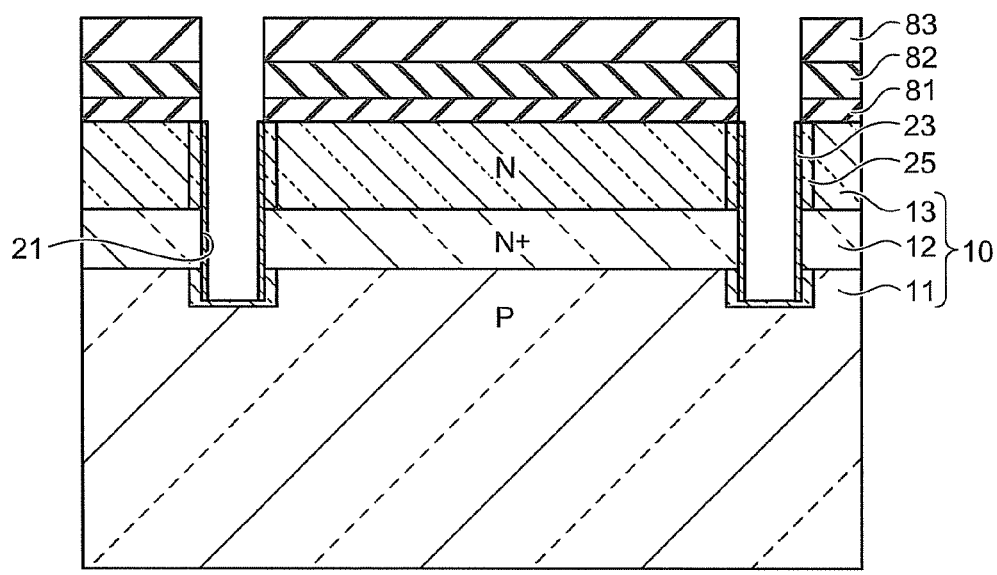

Thereafter, as shown in FIG. 5E, etching of the entire surface is performed by using the RIE method. Specifically, etch-back is performed by the RIE method to remove the first sidewall oxide films 23 formed on the bottom of the first trench 21 and leave the first sidewall oxide films 23 as sidewalls only on the sides of the first trench 21.

Figure 5F:
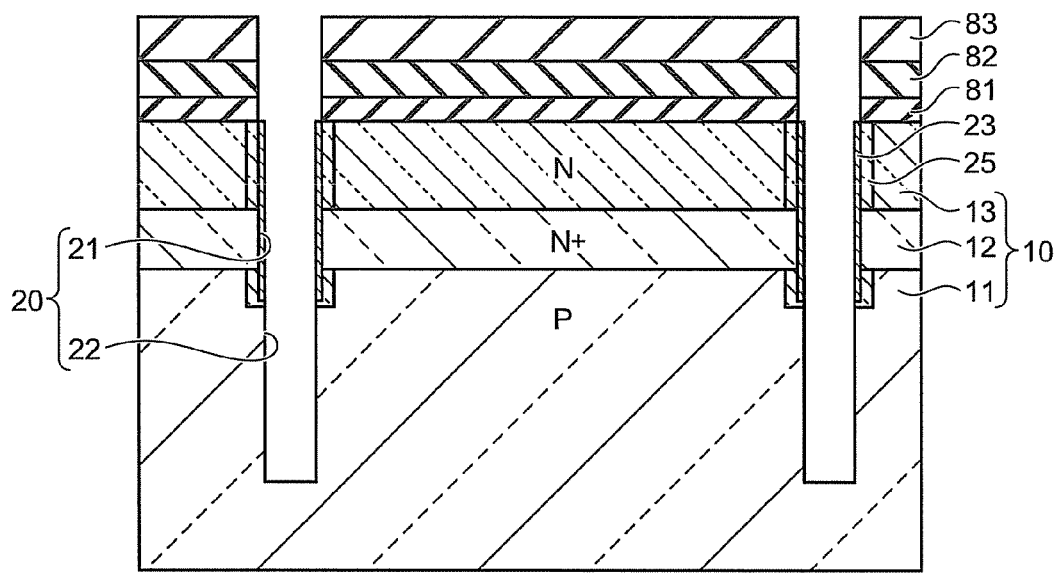

Subsequently, as shown in FIG. 5F, the second trench 22 is formed below the first trench 21 in a self-aligning manner by the RIE method with the mask film 83 left by about 200 nanometers as a mask. The depth of the second trench 22 is set to 5 micrometers including the depth (2 micrometers) of the first trench 21. Consequently, the deep trench 20 including the first trench 21 and the second trench 22 is formed.

Figure 5G:
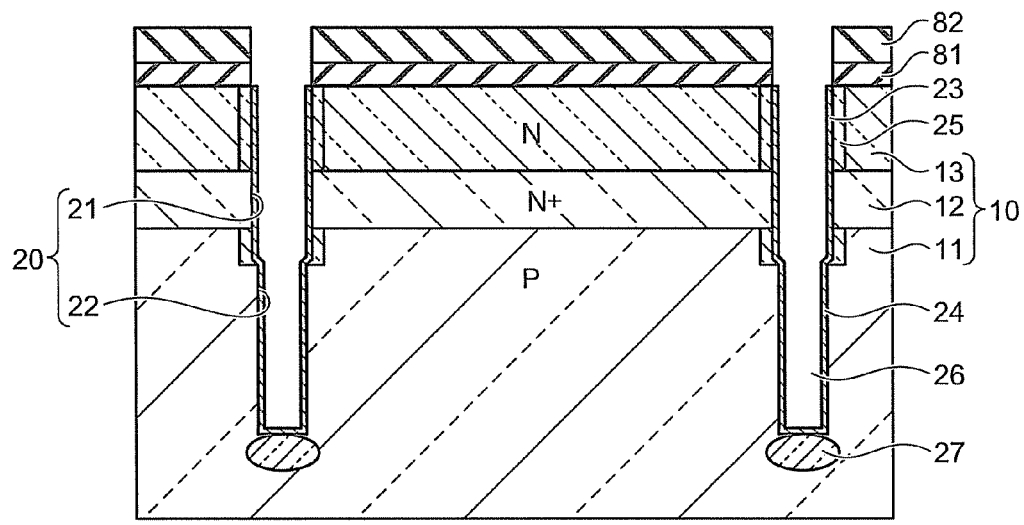

After the second trench 22 is formed, as shown in FIG. 5G, the second sidewall oxide films 24 having thickness of 50 nanometers is formed on the inner surfaces (the side and the bottom surface) of the second trench 22 by the oxidation technique. Because the N+ buried layer 12 is not exposed to the surface by the formation of the second trench 22, in this oxidation processing, outward diffusion due to the N-type impurities included in the N+ buried layer 12 does not occur. Specifically, the N-type diffusion layers 25 diffusing from the N+ buried layer 12 are not formed on the sides of the inner walls of the second trench 22, a profile of the substrate 10 is maintained, and the second sidewall oxide films 24 including only silicon oxide film is formed. Thereafter, to improve breakdown voltage of element isolation, ion implantation of the P-type impurities such as B is performed to form the P-type impurity layer 27 on the bottom of the deep trench 20.

Figure 5H:
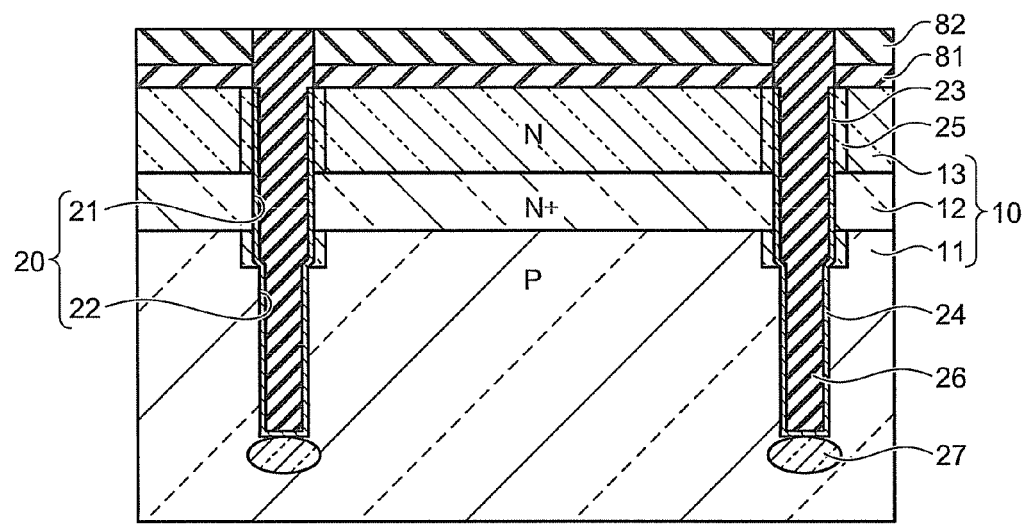

Subsequently, as shown in FIG. 5H, a TEOS film having thickness of 500 nanometers is formed by the LPCVD method over the entire surface on the mask film 83 in which the deep trench 20 are formed. Consequently, the TEOS film is formed on the mask film 83 and buried in the deep trench 20. Thereafter, the TEOS film formed on the mask film 83 is removed and planarized by the CMP method. Further, the TEOS film is etched by the RIE method with the stopper film 82 as a stopper. Specifically, the etching is performed until the surface of the stopper film 82 is exposed under a condition in which the TEOS film is more easily etched than the stopper film 82. Consequently, the deep trench film 26 including the TEOS film is formed in the deep trench 20.

Thereafter, a not-shown mask material insulation film as a mask material for processing the shallow trench 30 is formed on the stopper film 82 at thickness of, for example, 100 nanometers. A not-shown resist is applied over the mask material insulation film and patterning for forming the shallow trench 30 for isolating an active region is performed by the lithography technique.

Figure 5I:
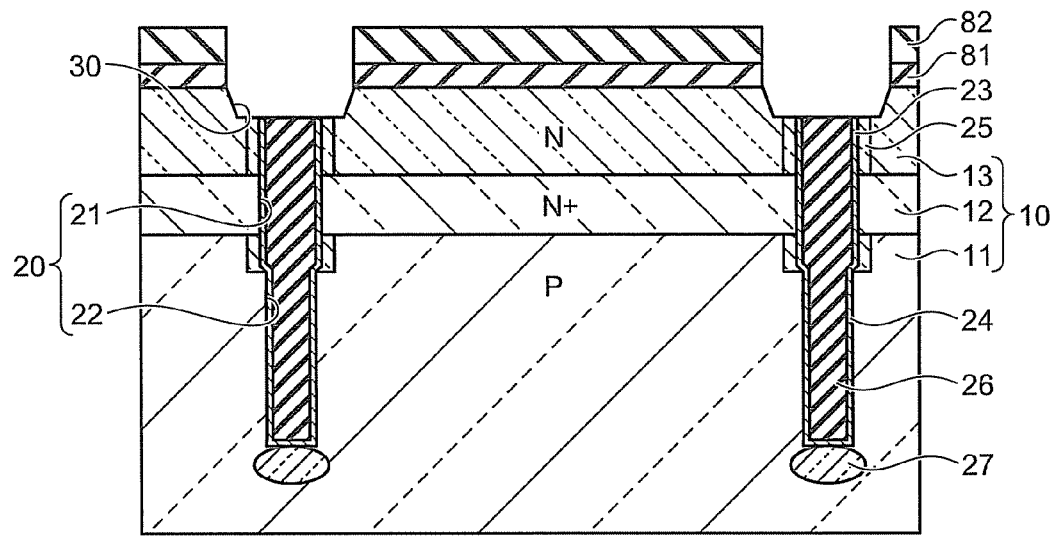

Subsequently, as shown in FIG. 5I, the mask material insulation film, the stopper film 82, and the buffer oxide film 81 are etched by the RIE method with the patterned resist as a mask. A pattern for shallow trench formation is transferred onto the mask material insulation film. After the resist is removed by resist stripping, the substrate 10 (the N-type semiconductor layer 13) is etched with the mask material insulation film as a mask to form the shallow trench 30. The depth of the shallow trench is set to 0.3 micrometer. Because depth from the upper surface of the N+ buried layer 12 to the surface of the substrate 10 is about 1 micrometer, the depth of the shallow trench 30 is sufficiently depthless. The TEOS film in the deep trench 20 is simultaneously etched during the processing of the shallow trench 30. Therefore, the shallow trench 30 is also formed in the upper parts of the deep trench 20.

Figure 5J:
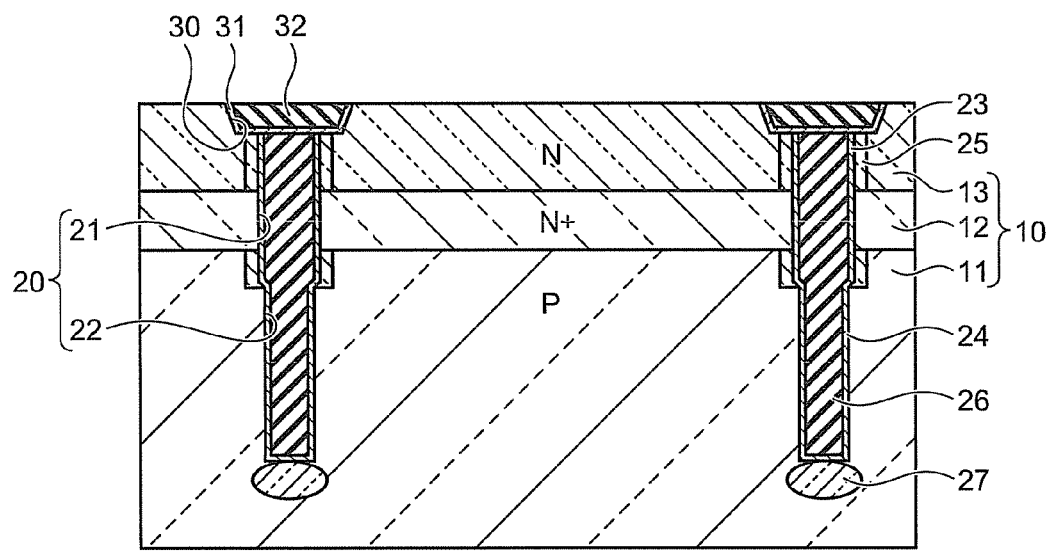

Subsequently, as shown in FIG. 5J, the shallow trench sidewall oxide film 31 having thickness of 50 nanometers is formed by the oxidation technique for the purpose of protecting the sidewalls of the shallow trench 30. Thereafter, the TEOS film is filled with the shallow trench 30 by the LPCVD method. Steps formed after the film formation are planarized by the CMP method with the stopper film 82 as a stopper. After the CMP processing, the unnecessary stopper film 82 is removed by the wet etching method using hot phosphoric acid or the like. Consequently, a region on the substrate 10 defined by the deep trench film 26 and the shallow trench films 32 is formed as an element forming region.

Figure 5K:
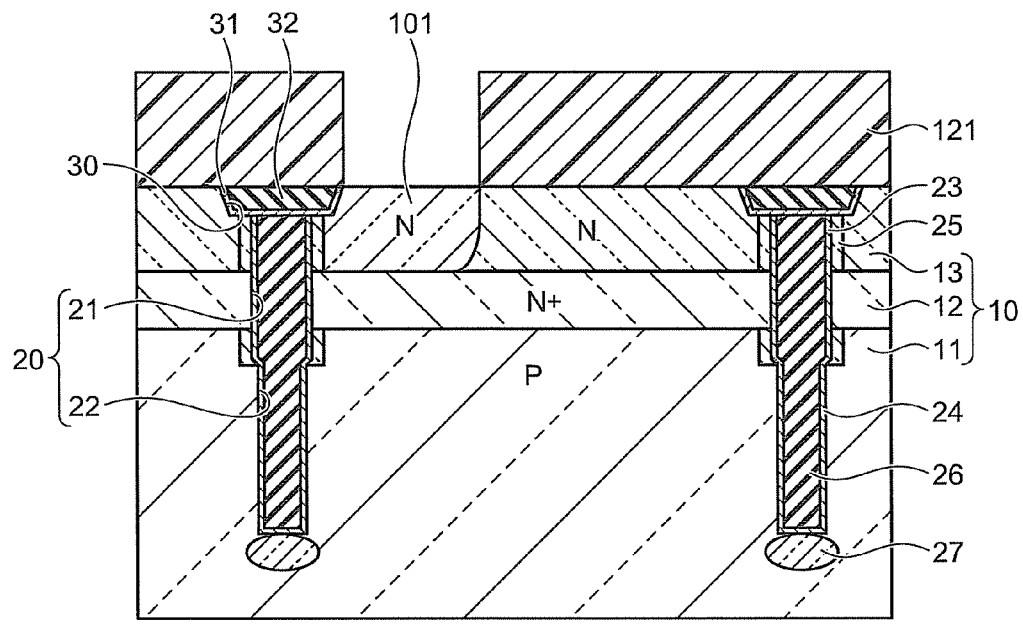

Thereafter, formation of a high-frequency semiconductor element on the element forming region is performed. First, as shown in FIG. 5K, a resist 121 is applied over the entire surface on the substrate 10 in which the deep trench film 26 is formed and patterned by the lithography technique to have opening near a collector region 101. The N-type impurities such as P are introduced to the depth of the N+ buried layer 12 from the surface of the substrate 10 and activated to form the collector region 101.

Figure 5L:
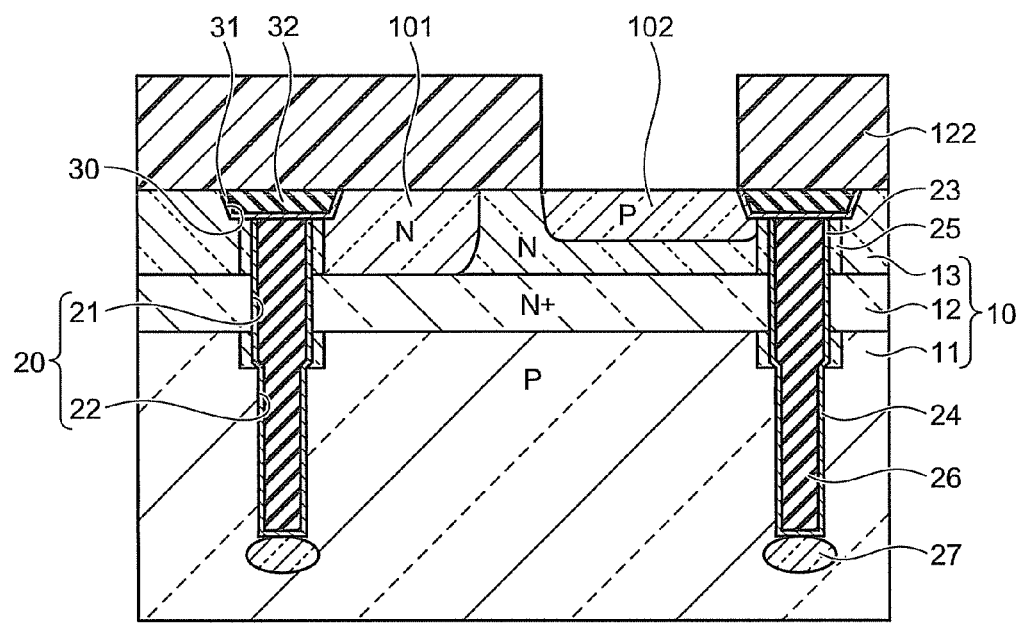
Figure 5M:
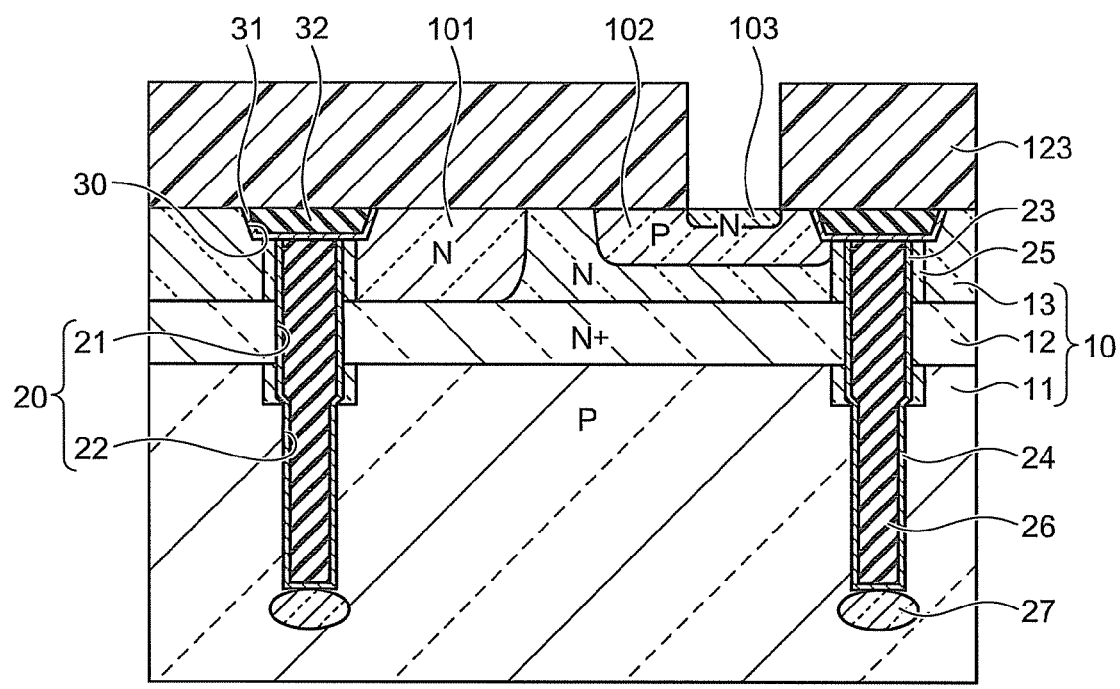

After the resist 121 is removed by the method such as resist stripping, as shown in FIG. 5L, a resist 122 is applied over the entire surface on the substrate 10 and patterned by the lithography technique to have opening in the base region 102. The P-type impurities such as B are introduced to predetermined depth in the N-type semiconductor layer 13 from the surface of the substrate 10 by the ion implantation method and activated to form the base region 102. The base region 102 is formed at a predetermined distance from the collector region 101.

After the resist 122 is removed by the method such as resist stripping, a resist 123 is applied over the entire surface of the substrate 10 and patterned by the lithography technique to have opening in the base region 102. The N-type impurities such as P are introduced to predetermined depth in the base region 102 from the surface of the substrate 10 and activated to form the emitter region 103.

After the resist 123 is removed by the method such as resist stripping, a conductive material film is formed over the entire surface on the substrate 10 and a resist is further applied over the conductive material film. Patterns for forming the collector electrode 111, the base electrode 112, and the emitter electrode 113 are respectively formed on the collector region 101, the base region 102, and the emitter region 103 by the lithography technique. Thereafter, etching of the conductive material film is performed by the RIE method with the resist as a mask. Consequently, as shown in FIG. 4, the collector electrode 111, the base electrode 112, and the emitter electrode 113 are respectively formed on the collector region 101, the base region 102, and the emitter region 103. According to the procedure explained above, a NPN transistor as a high-frequency semiconductor element is manufactured.

Figure 6:
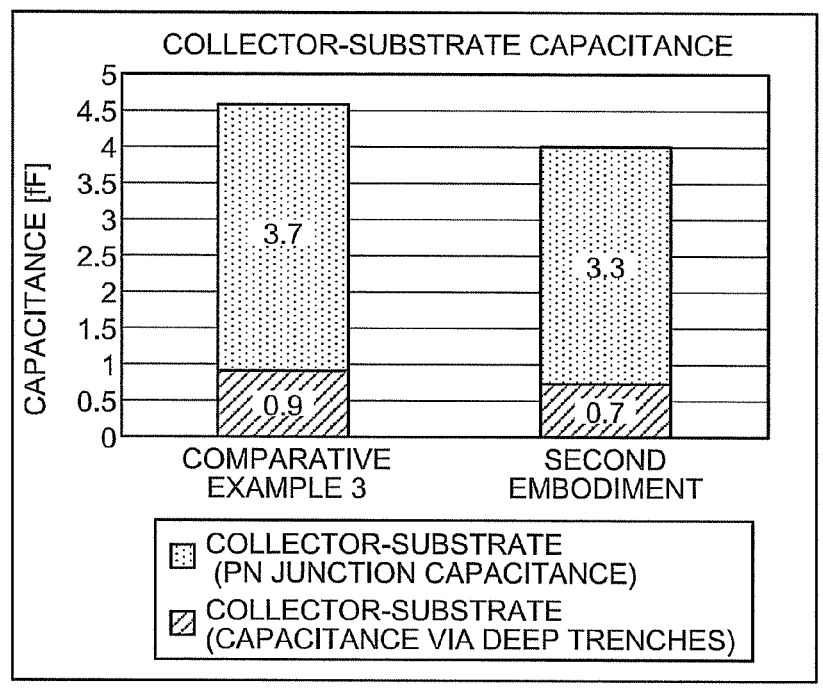
FIG. 6 is a diagram of an example of collector-substrate capacitance according to a difference in the configuration of deep trench.

FIG. 6 is a diagram of an example of collector-substrate capacitance according to a difference in the configuration of deep trench. Capacitance is measured by using a high-frequency semiconductor device manufactured by using a technique for manufacturing a device having a minimum dimension of 0.13 micrometers. Collector-substrate capacitance can be classified into first capacitance by PN junction between the collector region 101 and the silicon substrate 11 and second capacitance via the deep trench 20. In a comparative example 3, as described in Japanese Patent Application Laid-Open No. 2003-297845, when oxide films are formed on the sidewalls of the deep trench 20, deep trench is formed to final depth, oxidation processing is performed with an N+ buried layer exposed, and N-type diffusion layers diffusing from N+ buried layer are formed along the sidewalls of the deep trench.

In the deep trench 20 according to the second embodiment, because the formation of the N-type diffusion layers 25 below the N+ buried layer 12 is suppressed, extension of a depletion layer is suppressed. As a result, capacitance falls compared with the comparative example 3 and there is an effect that a high-frequency characteristic can be improved.

Figure 7:
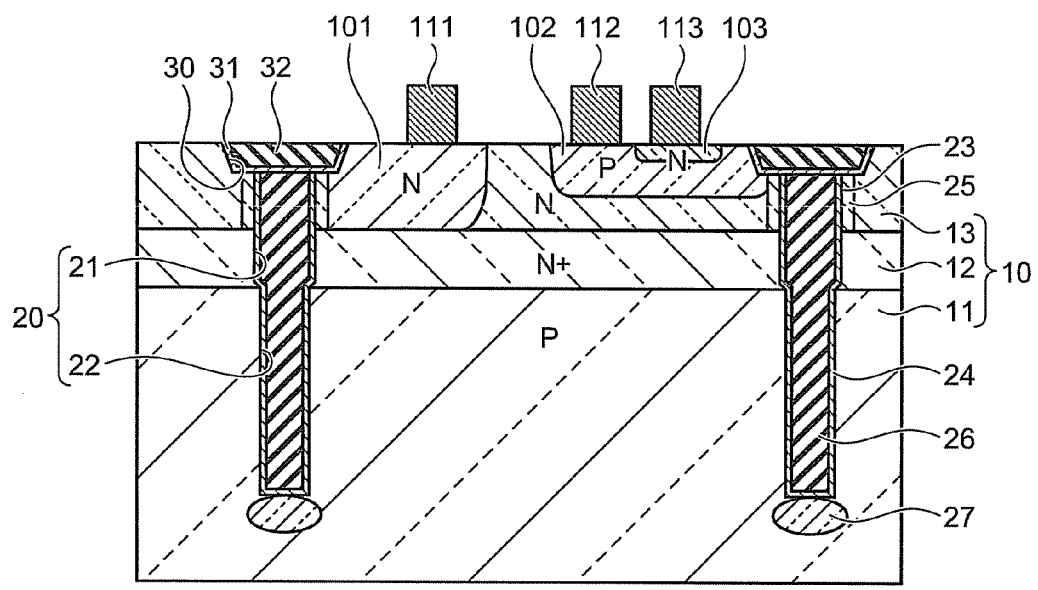
FIG. 7 is a schematic sectional view of a modification of the structure of the semiconductor device according to the second embodiment.

FIG. 7 is a schematic sectional view of a modification of the structure of a semiconductor device according to the second embodiment. In the semiconductor device shown in FIG. 7, the boundary between the first trench 21 and the second trench 22 included in the deep trench 20 in FIG. 4 is provided in the N+ buried layer 12, in particular, near a boundary on the P-type silicon substrate 11 side in the N+ buried layer 12.

Components same as those shown in FIG. 4 are denoted by the same reference numerals and signs and explanation of the components is omitted.

In deep trench 70 shown in FIG. 7, when a boundary position between the first and second trenches 21 and 22 is changed in the N+ buried layer 12, an exposure area of the N+ buried layer 12 changes when the second trench 22 is formed. A diffusion amount of the N-type diffusion layers 25 formed on the sidewalls of the second trench 22 can be controlled according to the exposure area of the N+ buried layer 12. In other words, a relation between inter-element breakdown voltage and inter-element capacitance can be controlled according to the boundary position between the first and second trench 21 and 22.

In the example explained above, the semiconductor device has the N+ buried layer 12 in the P-type semiconductor substrate. However, conversely, the embodiment can also be applied to a semiconductor device having a P-type buried layer in an N-type semiconductor substrate. The semiconductor substrate is not limited to the silicon substrate 11. Other semiconductor substrates of gallium arsenide and the like can also be used.

In the above explanation, the deep trench 20 has the structure in which the two trenches, i.e., the first trench 21 and the second trench 22 having the opening diameter smaller than that of the first trench 21 are connected in series. However, the deep trench 20 can also have a structure in which three or more trenches are connected in series.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate in which, on a semiconductor substrate of a first conductivity type, a buried layer of a second conductivity type and a semiconductor layer of the second conductivity type having concentration of impurities of the second conductivity type lower than that of the buried layer and having predetermined thickness are stacked;
   a trench that is formed in the substrate deeper than a forming position of the buried layer and define an element forming region in the substrate;
   an element isolation insulation film including sidewall oxide films formed along inner walls of the trench and a buried film that fills the trench covered by the sidewall oxide films; and
   a semiconductor element formed in the element forming region defined by the element isolation insulation film, wherein
   the trench includes a first trench formed from a surface of the substrate to predetermined boundary depth and a second trench formed from the boundary depth to a bottom and having an opening diameter smaller than that of the first trench,
   first diffusion layers connected to the buried layer are formed only around sidewalls of the second trench, and
   the semiconductor element includes:
      a source region including an impurity diffusion layer of a predetermined conductivity type formed on a surface of the element forming region;
      a drain region formed on the surface of the element forming region to be away from the source region and including an impurity diffusion layer of the predetermined conductivity type;
      a gate electrode formed via a gate insulation film on the element forming region between the source region and the drain region;
      a source electrode connected to the source region; and
      a drain electrode connected to the drain region.

2. The semiconductor device according to claim 1, wherein depth of a boundary between the first and second trenches is present in the semiconductor layer.

3. The semiconductor device according to claim 2, wherein the semiconductor element is an LDMOS and the LDMOS further includes:
   a drift region of the predetermined conductivity type formed adjacent to the drain region from the drain region to a lower part of the gate electrode and having concentration of impurities lower than that of the drain region.

4. The semiconductor device according to claim 1, further comprising a second diffusion layer in which impurities of the first conductivity type are diffused below the element isolation insulation film.

5. The semiconductor device according to claim 1, wherein the buried film is insulation film or semiconductor film.

6. The semiconductor device according to claim 1, wherein the buried film is silicon oxide film or silicon film.

7. The semiconductor device according to claim 1, wherein the first diffusion layers are formed around the second trench according to the inter-element breakdown voltage required of the semiconductor element.

* * * * *